US010822840B2

(12) United States Patent
DeWalch et al.

(10) Patent No.: US 10,822,840 B2
(45) Date of Patent: Nov. 3, 2020

(54) SECURING APPARATUS AND METHOD

(75) Inventors: Norman Binz DeWalch, Houston, TX (US); Tyler Dean Todd, II, Houston, TX (US)

(73) Assignee: DeWalch Technologies, Inc., Houston, TX (US)

( * ) Notice: Subject to any disclaimer, the term of this patent is extended or adjusted under 35 U.S.C. 154(b) by 0 days.

(21) Appl. No.: 12/944,719

(22) Filed: Nov. 11, 2010

(65) Prior Publication Data

US 2011/0198865 A1   Aug. 18, 2011

Related U.S. Application Data

(60) Provisional application No. 61/260,387, filed on Nov. 11, 2009, provisional application No. 61/260,418, filed on Nov. 12, 2009, provisional application No. 61/293,703, filed on Jan. 10, 2010, provisional application No. 61/293,724, filed on Jan. 11, 2010.

(51) Int. Cl.
| | |
|---|---|
| *E05B 65/00* | (2006.01) |
| *E05C 19/00* | (2006.01) |
| *E05B 65/08* | (2006.01) |
| *G01R 11/24* | (2006.01) |

(52) U.S. Cl.
CPC ...... *E05B 65/0089* (2013.01); *E05B 65/0888* (2013.01); *E05C 19/003* (2013.01); *G01R 11/24* (2013.01); *Y10T 292/08* (2015.04)

(58) Field of Classification Search
CPC . E05B 65/0888; E05B 65/0089; E05C 19/003
USPC ... 70/2, 6–14, 34, 54–56, 63, 158–173, 232, 70/370–371, 386, 451, 466, 449
See application file for complete search history.

(56) References Cited

U.S. PATENT DOCUMENTS

| | | | | |
|---|---|---|---|---|
| 4,413,852 | A | * | 11/1983 | Burnell et al. ............ 292/259 R |
| 5,007,258 | A | * | 4/1991 | Mahaney ........................ 70/159 |
| 5,103,659 | A | * | 4/1992 | Benefield, Sr. .................. 70/94 |
| 5,267,688 | A | * | 12/1993 | Benefield ........................ 232/17 |
| 5,419,165 | A | * | 5/1995 | Perkins ............................ 70/14 |
| 5,466,023 | A | * | 11/1995 | Williamson ............. 292/259 R |

(Continued)

OTHER PUBLICATIONS

Ad/Brochure/etc.—Inner-Tite Product Data Sheet for Johnny Bar (2 pages).*—*(No admission is being made regarding applicability, relevancy, materiality or otherwise and as per IDS Statement Submitted herewith).

(Continued)

*Primary Examiner* — Christopher J Boswell
(74) *Attorney, Agent, or Firm* — DeWalch Technologies, Inc.

(57) ABSTRACT

A securing apparatus is provided for securing, in one embodiment, a plurality of enclosures, such as for example, a plurality of electric meter boxes, the apparatus being mountable to the at least one of the plurality of enclosures. The securing apparatus comprises an enclosure locking member which includes at least a bracket arm, a fastening member and a housing mountable to at least one enclosure; the securing apparatus further comprises a securing member having first and second ends, with the securing member including at least a securing bar and a coupling member being moveably attachable to the securing bar, wherein the coupling member is pivotably mateable with the extended flange of the enclosure locking member.

3 Claims, 48 Drawing Sheets

(56) References Cited

U.S. PATENT DOCUMENTS

| | | | | |
|---|---|---|---|---|
| 5,799,521 | A | * | 9/1998 | Kennedy ..................... 70/416 |
| 5,870,911 | A | | 2/1999 | DeWalch et al. |
| 6,705,652 | B2 | * | 3/2004 | Engel ..................... 292/259 R |
| 6,722,541 | B1 | * | 4/2004 | Aftanas et al. ............. 224/403 |
| 7,197,905 | B2 | * | 4/2007 | Ely et al. ................... 70/164 |
| 7,681,421 | B2 | * | 3/2010 | Cannon ........................ 70/14 |
| 2011/0203335 | A1 | | 8/2011 | DeWalch |

OTHER PUBLICATIONS

Ad/Brochure/etc.—Product Data Sheet for Body Cote (4 pages).
*—*(No admission is being made regarding applicability, relevancy, materiality or otherwise and as per IDS Statement Submitted herewith).
Preliminary Amendment dated May 2, 2011 in connection with (U.S. Appl. No. 12/945,832) (5 pages).
Office Action dated Jun. 3, 2013 in connection with (U.S. Appl. No. 12/945,832) (9 pages).
Office Action Response dated Dec. 3, 2013 in connection with (U.S. Appl. No. 12/945,832) (119 pages).
Final Office Action dated Feb. 18, 2014 in connection with (U.S. Appl. No. 12/945,832) (6 pages).
Request for Continued Examination with Office Action Response dated Aug. 18, 2014 in connection with (U.S. Appl. No. 12/945,832) (17 pages).
Office Action dated Dec. 9, 2014 in connection with (U.S. Appl. No. 12/945,832) (8 pages).
Office Action Response dated Jun. 9, 2015 in connection with (U.S. Appl. No. 12/945,832) (17 pages).
Final Office Action dated Sep. 18, 2015 in connection with ((U.S. Appl. No. 12/945,832) (8 pages).
Request for Continued Examination with Office Action Response dated Mar. 18, 2016 in connection with (U.S. Appl. No, 12/945,832) (17 pages).
Office Action dated Jun. 24, 2016 in connection with (U.S. Appl. No. 12/945,832) (7 pages).
Office Action Response dated Dec. 22, 2016 in connection with (U.S. Appl. No. 12/945,832) (17 pages).
Final Office Action dated Mar. 15, 2017 in connection with (U.S. Appl. No. 12/945,832) (8 pages).
Request for Continued Examination with Office Action Response dated Aug. 15, 2017 in connection with (U.S. Appl. No. 12/945,832) (21 pages).
Office Action dated Jan. 5, 2108 in connection with (U.S. Appl. No. 12/945,832) (7 pages).
Office Action Response dated Jul. 5, 2018 in connection with (U.S. Appl. No. 12/945,832) (21 pages).
Final Office Action dated Oct. 10, 2018 in connection with (U.S. Appl. No. 12/945,832) (6 pages).
Request for Continued Examination with Office Action Response including IDS dated Apr. 10, 2019 in connection with (U.S. Appl. No, 12/945,832) ( pages).

* cited by examiner

FIG. 3A  FIG. 3B

DETAIL P
SCALE 1 : 2

SECTION L-L
SCALE 1 : 1

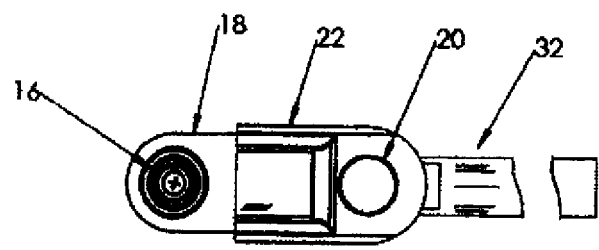
FIG. 11A
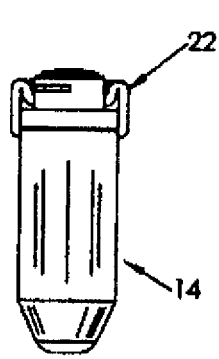
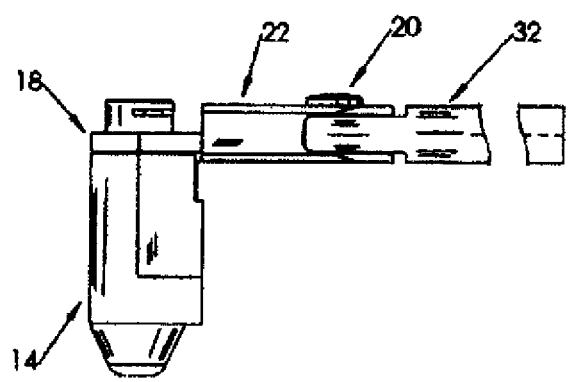
FIG. 11B
FIG. 11C

SECTION E-E

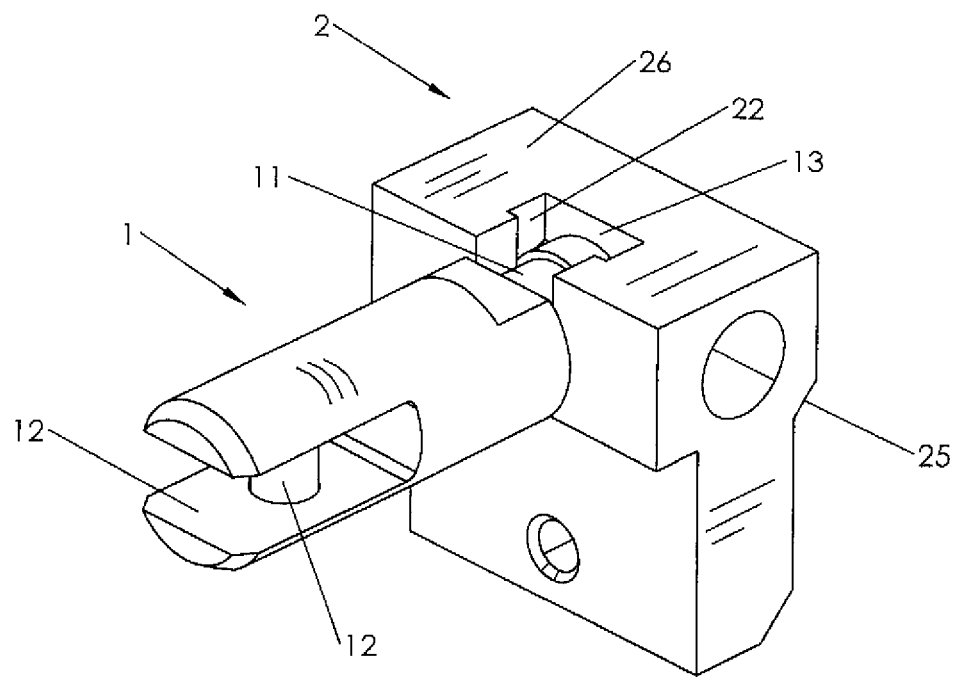
FIG. 35A1
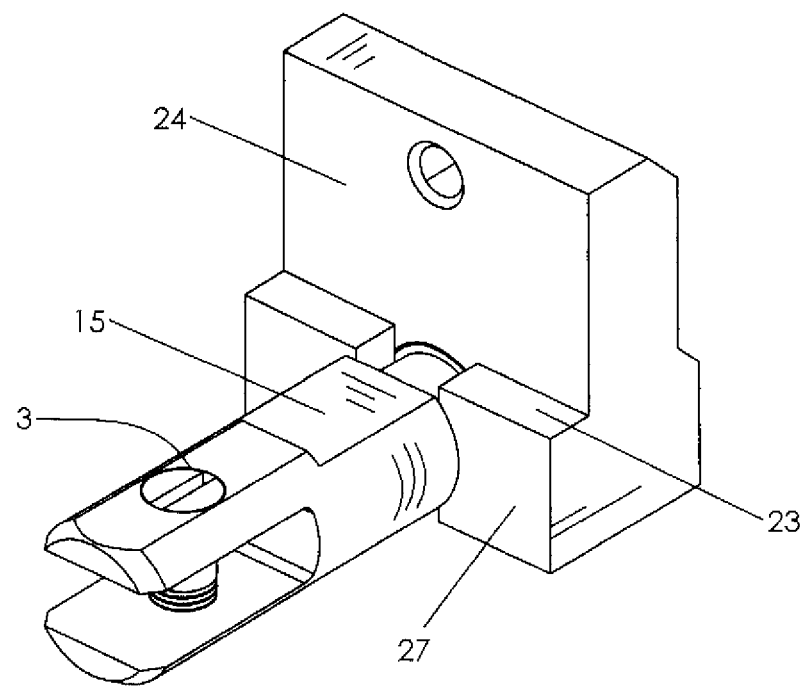
FIG. 35A2

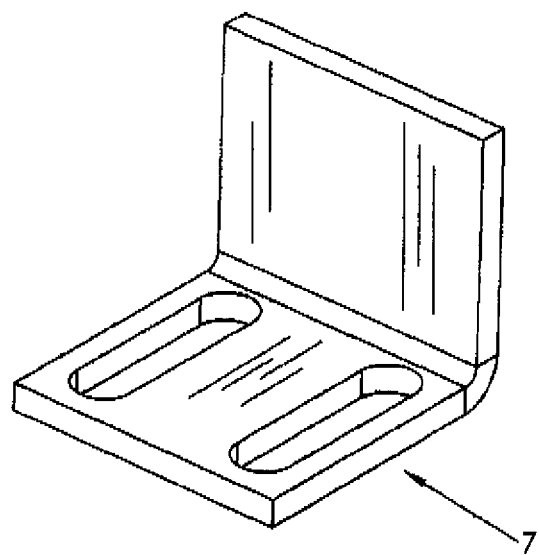
FIG. 35C
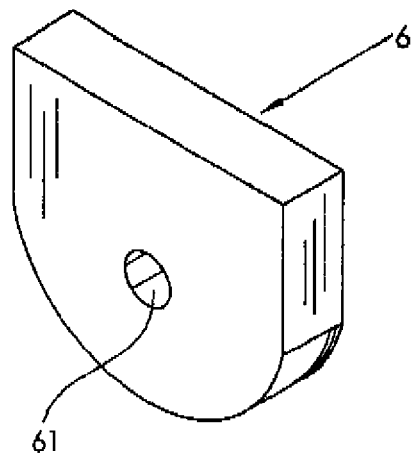
FIG. 35D1

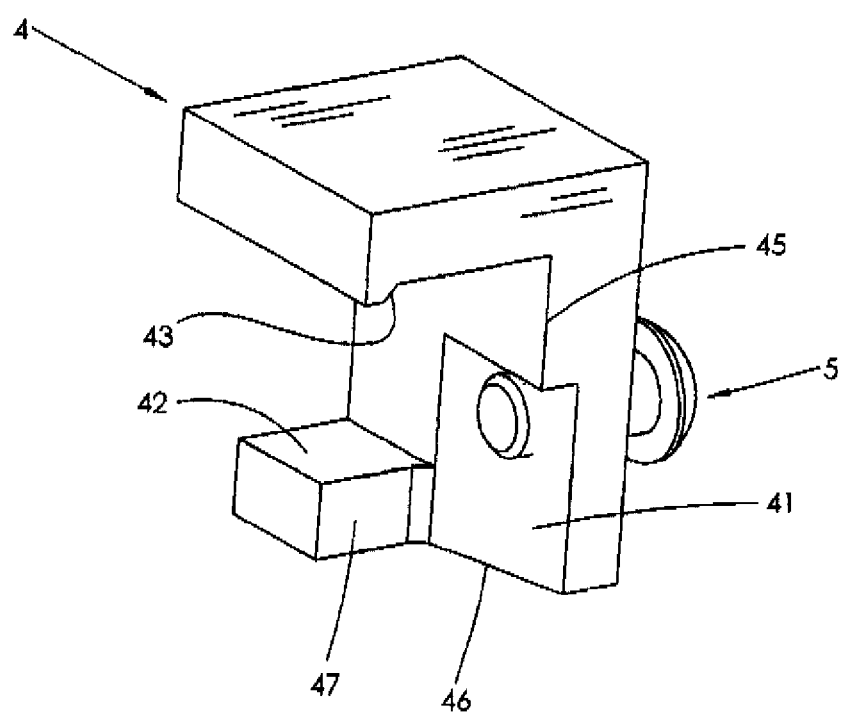
FIG. 35D2

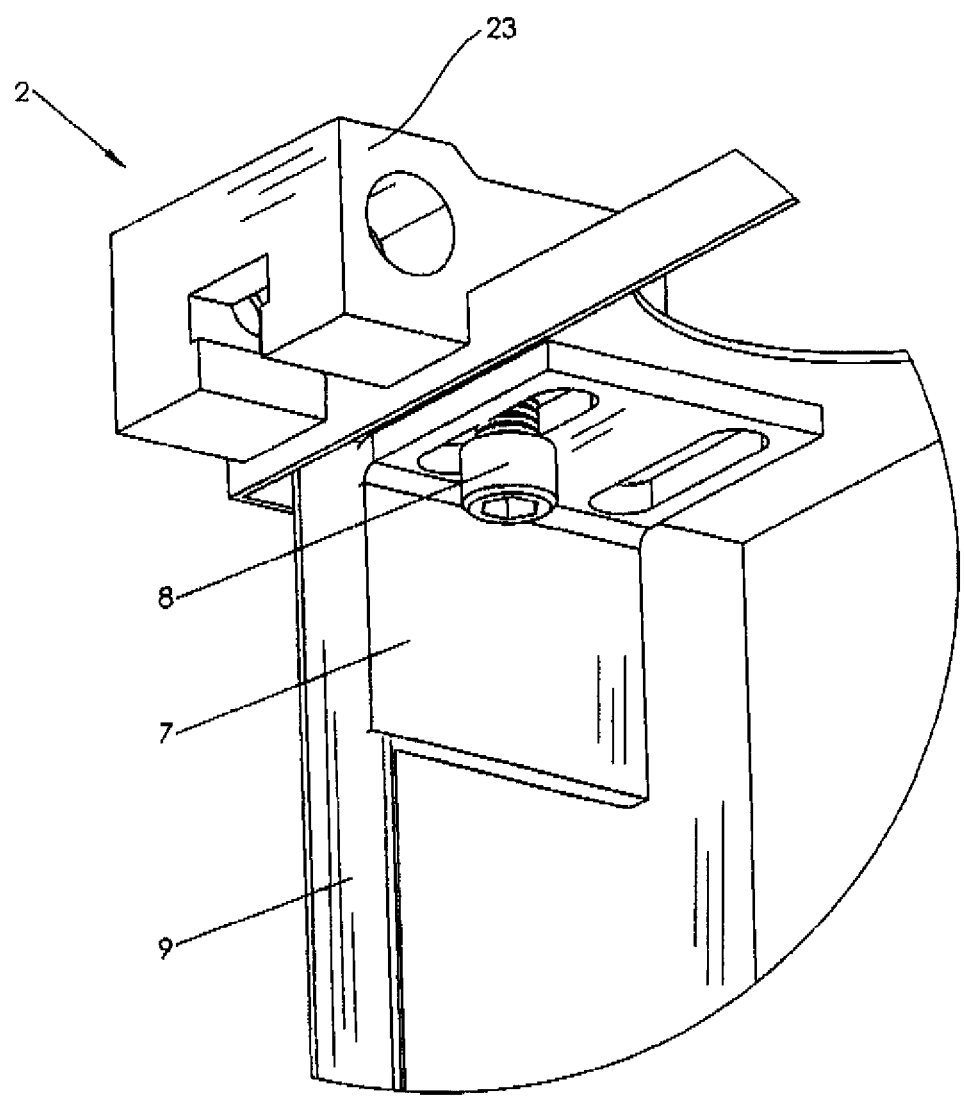
FIG. 35D3

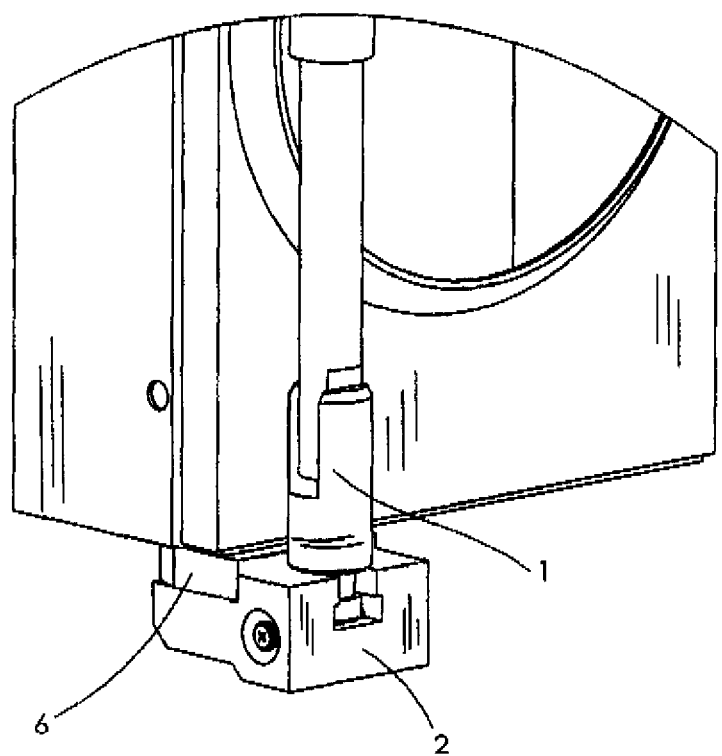
FIG. 35D4

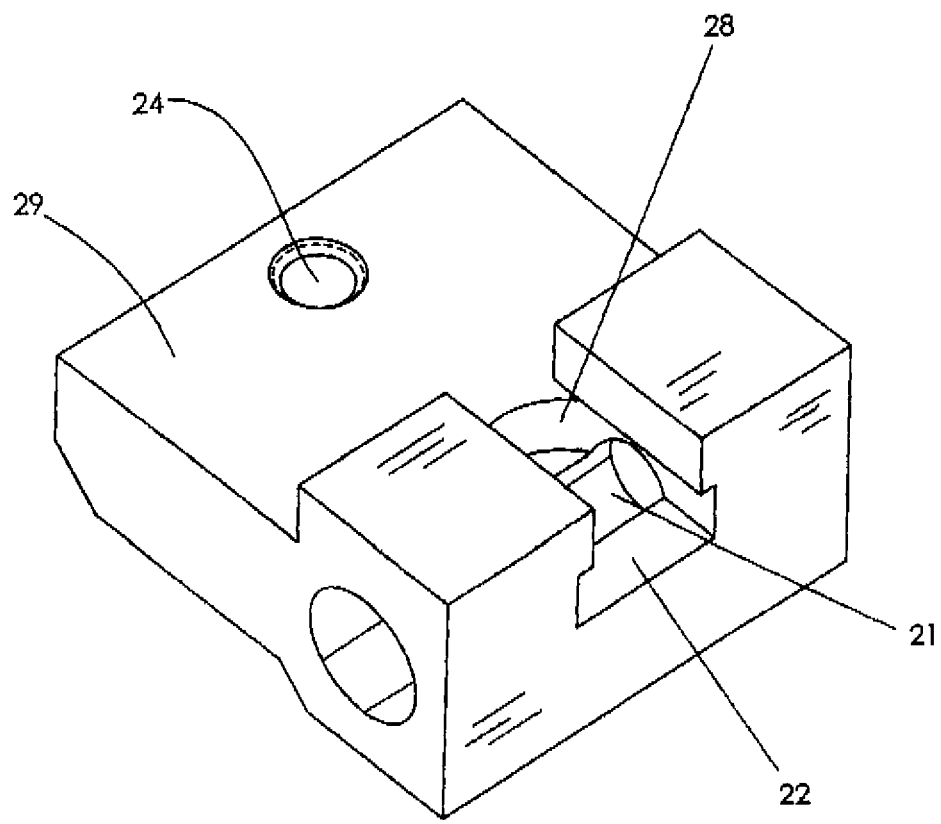
FIG. 35D5

SECURING APPARATUS AND METHOD

CROSS-REFERENCE TO RELATED APPLICATIONS

This application claims the benefit of U.S. Provisional Application No. 61/260,387, filed on Nov. 11, 2009, and U.S. Provisional Application No. 61/260,418, filed on Nov. 12, 2009, and U.S. Provisional Application No. 61/293,703, filed on Jan. 10, 2010, U.S. Provisional Application No. 61/293,724, filed on Jan. 11, 2010.

All written material, figures, content and other disclosure in each of the above-referenced applications is hereby incorporated by reference.

BACKGROUND OF THE INVENTION

The present invention relates generally to a securing apparatus, and more specifically, it relates to a securing apparatus for securing at least one structure or a plurality of structures and may be used to secure a utility service enclosure, or for example, a watthour meter socket box to prevent unauthorized access.

For example, in the electric utility industry, electrical service providers generally deliver electricity to their customers via power lines buried underground or distributed along poles or towers overhead. The provider's power lines are usually distributed from a power generation station to numerous sets of customer lines, so that customers can then use the power to satisfy their various electrical needs. To measure delivered power so that customers can be billed in proportion to their usage, service providers typically terminate their power lines at a customer's home or business facility through a metered socket box, various designs for which are well known.

One previously known meter box, for example, consists of two sets of electrical posts, with a provider's transmission lines being connected to one set of posts, and the customer's service lines to the other set. In order to measure the amount of electricity a customer uses, the meter box is configured to accept a watt-hour meter or another electricity usage measurement device, which, when plugged into the socket box, permits transmission of electricity from the provider to the customer and allows the amount of transmitted electricity to be accurately measured, so that the provider can charge the customer for power usage at an appropriate rate. In areas such as commercial complexes and apartments, meter boxes are mounted in a multi-meter array called a gang. In order to prevent unauthorized access to the meter boxes, a bar extended across the meter boxes is used to secure them; the bar is locked on both ends of the meter boxes. Some devices used in such applications include a lock device which may be used to individually lock meter boxes or in conjunction with what is sometimes referred to as a gang bar. Other devices include a gang bar with a fixed lock component utilizing a swivel joint such that the swivel joint enables attachment in various configurations. However, unlike other gang bars, the lock and bar are integrated and the combination cannot be attached and effectively used with locks commonly used by industry.

In an attempt to overcome some of these shortcomings, there have been locking devices that can be installed on meter socket boxes. Several examples of patents which disclose attempts to solve some of the above problems are set forth as follows.

U.S. Pat. No. 7,197,905 to Ely et al., entitled "Meter Box Locking Bar Assembly," is directed to a multi-meter locking bar assembly for locking a plurality of meter boxes of a gang of meter boxes includes a locking bar having opposing first and second ends. A locking device is pivotally fixed relative to the locking bar. The locking device is fixable to one of the meter boxes to lock the locking bar over at least one meter box to lock the meter box. This reference is incorporated by reference herein.

U.S. Pat. No. 5,870,911 to DeWalch, entitled "Electric Meter Box Lock," sets forth that a lock for meter boxes and similar enclosures includes an outer case with a central bore mounted on an electric meter box. Inside the bore are two extrusions of unequal length spaced 90 degrees apart. A sleeve having a deep bore is held in the case by a screw, and a spring assembly transmits motion from the screw to the sleeve. The sleeve includes a flange at its end with an arcuate cutout portion which spans both extrusions. The sleeve further includes several internal grooves for retaining a barrel type lock which prevents access to the screw. A heavy cover plate is welded to the top of the sleeve so that it overlays and retains the door of the meter box. To unlock the meter box lock, the barrel lock is removed to allow access to the screw. As the screw is unscrewed, the sleeve moves with the screw until the flange on the sleeve clears the shorter extrusion. The sleeve then rotates with the screw until the flange engages the longer extrusion. In this position, the cover plate no longer overlays the door, and the door can be opened. This reference is incorporated by reference herein.

Inner-Tite Product Data Sheet for Johnny Bar (See attached). This reference is incorporated by reference herein.

There remains a need for a securing apparatus and method for securing at least one structure or a plurality of structures, used with, for example, a utility service enclosure, or more particularly, a watthour meter box having a removable cover with the securing apparatus being adaptable for use in various configurations, with different types of locks to secure a gang of watthour meters from unauthorized access so as to provide higher security and ease of installation. There is also a need for a securing apparatus that is less cumbersome and awkward to use and which can be readily and modularly installed and is adapted to facilitate handling and positioning of same. There is also need for a securing apparatus which comprises interface structures permitting interchangeability with components of other locking systems.

Those of skill in the art will appreciate the example embodiments of the present invention which addresses the above needs and other significant needs the solution to which are discussed hereinafter.

SUMMARY OF THE INVENTION

In an example embodiment, the securing apparatus is adapted to be mounted to secure a plurality of electric meter boxes. In one embodiment, the securing apparatus includes at least first and second enclosure locking members, a securing member having first and second ends with the securing member comprising a securing bar and first and second coupling members with each being moveably (in some embodiments pivotally or rotatably) attachable to the proximal distal ends of the securing bar. In an example embodiment, the coupling members are separably and slidably mateable with an extended member or mating portion, or bracket arm of each of respective first and second enclosure locking members.

In another example embodiment, provides a locking apparatus that includes at least an enclosure locking member comprising an extensible securing member and a coupling member wherein the coupling member is moveably attached to the securing member. The enclosure locking member is generally comprised of a lock, bracket arm and a housing. The securing member is comprised of a securing bar and two coupling members (or in some embodiments a link) joined at the ends of the securing bar by fasteners. The securing bar is, in some example embodiments, either a single rod or comprised of a tube and a rod assembly that can extend or retract. In some example embodiments, the coupling member assembly is comprised of a coupling member, square head screw (often referred to as a carriage nut) and a barrel nut.

One aspect of the present invention, which will be described subsequently in greater detail, is to secure a gang of watthour meter boxes from unauthorized access.

Another aspect of the present invention is to secure one or more watthour meter boxes or other enclosures with respect to one another.

In this respect, before explaining the present invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

To attain this, the present invention, in a non-limiting example embodiment, comprises a securing apparatus comprised of an enclosure locking member comprising an extendable securing member with a coupling member wherein said coupling member is moveably attached to the securing member.

In an example embodiment, the present invention includes at least a locking apparatus for securing at least one structure.

In another example embodiment, an enclosure lock (e.g., in some embodiments referred to as the Armadillo lock assembly) is generally comprised of a lock, bracket arm and lock housing.

In another example embodiment, a gang bar is comprised of a telescopic tube assembly and a coupling member (or in some embodiments a link) assembly. The telescopic tube assembly is comprised of a tube and a rod.

In another example embodiment, the coupling member assembly is comprised of coupling member, square head screw and a barrel nut.

There has thus been outlined, rather broadly, features of the invention in order that the detailed description thereof may be better understood, and in order that the present contribution to the art may be better appreciated. There are additional features of the invention that will be described hereinafter.

Another aspect of the invention is to lock boxes whose side access limitation prevents direct attachment of lock device.

Another aspect of the present invention is to secure a gang of enclosures with hinged openings.

Another aspect of the invention is to secure a large cabinet with multiple doors.

Another aspect of the present invention is to provide a locking assembly that can be installed without special tools.

Other aspects and advantages of the present invention will become obvious to the reader and it is intended that these aspects and advantages are within the scope of the present invention.

To the accomplishment of the above and related aspects as well as objects, this invention may be embodied in the form illustrated in the accompanying drawings, attention being called to the fact, however, that the drawings are illustrative only, and that changes may be made in the specific construction illustrated.

These and other aspects, features, and advantages of example embodiments of the present invention will become apparent from the drawings, the descriptions given herein, and the appended claims. Further aspects are also indicated herein in various example embodiments of the invention. However, it will be understood that the above-listed objectives and/or advantages of example embodiments are intended only as an aid in quickly understanding aspects of the example embodiments, are not intended to limit the embodiments of the invention in any way, and therefore do not form a comprehensive or restrictive list of objectives, and/or features, and/or advantages.

In other example embodiments, the present invention provides a securing apparatus for preventing access to at least one structure or a portion of a utility service enclosure such as, for example, a watthour meter box or a plurality of such boxes so as to address the needs as described above.

Another example embodiment of the present invention includes at least an apparatus for securing at least one enclosure, the apparatus being mountable to the at least one enclosure, the apparatus comprising: an enclosure locking member comprising a bracket arm, a fastening member (such as in some embodiments any of a variety of suitable locking devices including barrel locks or plunger locks) and a housing mountable to at least one enclosure; a securing member having first and second ends, the securing member comprising a securing bar and a coupling member being moveably attachable to the securing bar, wherein the coupling member is pivotably mateable with the extended flange (or pivoting arm) of the enclosure locking member.

Another example embodiment of the present invention includes at least an apparatus for securing a plurality of electric meter boxes, the apparatus being mountable to the plurality of electric meter boxes, the apparatus comprising: an enclosure locking system comprising first and second enclosure locking members each comprising a bracket arm, a lock, and a housing mountable to at least one meter box; a securing member having first and second ends, the securing member comprising a securing bar, first and second coupling members each being moveably (in some embodiments pivotally or rotatably) attachable to the securing bar, and wherein each coupling member is moveably mateable or engageable with an extended flange of the bracket arm of its respective first or second enclosure locking member.

An example embodiment further provides an apparatus adapted to be mounted to secure at least one enclosure, the apparatus including at least: first and second enclosure locking members comprising a body portion and a mating portion; and a securing member having first and second ends with the securing member comprising a securing bar and first and second coupling members with each being moveably attachable to the proximal distal ends of the securing bar, wherein the first and second coupling members are separably mateable with a mating portion of each of the respective first and second enclosure locking members. In a further example embodiment, the apparatus above is provided wherein the at least one enclosure has a wall and sidewall and a cover oriented generally perpendicularly to the sidewall, wherein body portion of each of the first and second enclosure locking members forms a recess, the recess being adapted to receive a fastening member for fastening the enclosure locking member to a wall or sidewall. In still a further example embodiment, the apparatus above is provided wherein the recess is further adapted to receive a barrel lock comprising a generally cylindrical body with one or more retractable locking elements extending therefrom, wherein the barrel lock may be received and secured in the body portion in such a way as to protect the fastener from tampering.

A general purpose of the present invention, in an example embodiment, which will be described subsequently in greater detail, is to secure at least one structure or a plurality of structures, to prevent unauthorized access, for example, to secure a utility service enclosure, such as for example, a meter box having a removable panel or lid.

In another example embodiment, the present invention comprises an adjustable vertical telescopic tube assembly. Alternately, the horizontal members provide positional adjustment along the vertical axis defined by the tube. The adjustability enables the user to successfully attach the gang bar to any myriad of meter box size combinations that may occur in the field. Variation of box sizes, configurations, spacing and condition often negatively affects the ability of user or installer to successfully attach an non-adjustable gang bar. Additionally, many geographic markets have different meter box standards, which thereby requires a producer to offer many variations of same product with fixed horizontal members in axial positions specified by customer. Customization negatively affects a producer's production cost, inventories and fulfillment responsiveness. An adjustable assembly benefits customer and producer.

In another example embodiment, the present invention comprises a locking apparatus that is comprised of a low-profile or reduced-profile (e.g., sometimes referred to as Slimline) lock assembly and gang bar. The low-profile lock assembly is generally comprised of a barrel lock, a receiver arm and lock housing. Low-profile lock assembly accessories include at least: a spacer to enable attachment to a meter box on sides other than top (as top orientation allows overhang of housing); an attachment tool that fully seats receiver arm into housing (this tool is necessary when the enclosure is so deformed that the gang bar assembly makes it difficult to properly align receiver within housing to enable lock insertion); in some example embodiments, the receiver arm functions in a similar manner as the coupling member (or link) described herein with regard to other embodiments of the securing apparatus. It mates with the securing apparatus or gang bar telescopic assembly and housing to secure a meter box. An example aspect of the example embodiment of the present invention is to secure a gang of watthour meter boxes from unauthorized access. Another aspect of the invention is to lock boxes whose side access limitation prevents direct attachment of a lock device. Another aspect of the invention is to provide the ability to lock enclosures surrounded by physical encumbrances that significantly limit available space for attaching a locking device. Another aspect of the present invention is to secure a gang of enclosures with hinged openings. Another aspect of the invention is to secure a large cabinet with multiple doors.

Another example embodiment provides an apparatus adapted to be mounted to secure at least one enclosure, the apparatus including at least: first and second enclosure locking members each including at least a body portion and a mating portion, wherein the mating portion includes at least a flange; and a securing member having first and second ends with the securing member including at least a securing bar and first and second coupling members being pivotally attachable proximal respective first and second ends of the securing bar, wherein the first and second coupling members are slidably mateable with the respective flange of the mating portion of the respective first and second enclosure locking members, and wherein the first and second coupling members are slidably separable from the respective flange of the mating portion of the respective first and second enclosure locking members.

In another example embodiment of the apparatus, the at least one enclosure has a wall and sidewall and a cover oriented generally perpendicularly to the sidewall, wherein the body portion of each of the first and second enclosure locking members forms a recess, the recess being adapted to receive a fastening member for fastening the enclosure locking member to the wall or sidewall.

In another example embodiment of the apparatus, the recess is further adapted to receive a barrel lock including at least a generally cylindrical body with one or more retractable locking elements extending therefrom, wherein the barrel lock may be received and secured in the body portion in such a way as to protect the fastener from tampering.

The content and disclosure of each of the following applications/publications to the extent permitted are specifically hereby incorporated by reference: U.S. Pat. Nos. 7,176,376, and 5,870,911; U.S. application Ser. No. 12/317,086; U.S. application Ser. No. 12/378,879; U.S. Provisional Application No. 61/260,387, filed on Nov. 11, 2009, U.S. Provisional Application No. 61/260,418, filed on Nov. 12, 2009 and U.S. Provisional Application No. 61/293,703, filed on Jan. 10, 2010, U.S. Provisional Application No. 61/293,724, filed on Jan. 11, 2010; as well as U.S. patent application Ser. No. 11/705,653; U.S. patent application Ser. No. 10/823,285; U.S. patent application Ser. No. 11/434,665; International Patent Application No. PCT/US2006/018783; U.S. Provisional Application No. 60/681,200; U.S. Provisional Application No. 60/793,104; U.S. Provisional Application No. 60/681,200; and U.S. Provisional Application No. 60/793,104.

Additionally, all written material, figures, content and other disclosure in each of the above-referenced applications, is hereby incorporated by reference. In addition, the instant application claims priority as noted above.

There has thus been outlined, rather broadly, features of example embodiments of the invention in order that the detailed description thereof may be better understood, and in order that the present contribution to the art may be better appreciated. There are additional features of example embodiments of the invention that will be described hereinafter.

In this respect, before explaining at least one example embodiment of the invention in detail, it is to be understood that the example embodiments are not limited in its application to the details of construction and to the arrangements of the components set forth in the following description or illustrated in the drawings. Various example embodiments are capable of other further embodiments and of being practiced and carried out in various ways. Also, as emphasized, it is to be understood that the phraseology and terminology employed herein are for the purpose of the description and should not be regarded as limiting.

To the accomplishment of the above and related objects, example embodiments of the invention may be embodied in the form illustrated in the accompanying drawings, attention being called to the fact, however, that the drawings are illustrative only, and that changes may be made in the specific construction illustrated.

BRIEF DESCRIPTION OF THE DRAWINGS

Various other objects, features and attendant advantages of the embodiments of the invention will become fully appreciated as the same becomes better understood when considered in conjunction with the accompanying drawings, and wherein:

FIG. 3A is a side view of an example embodiment of the invention showing a gang bar assembly, in the locked position, installed onto watthour meter boxes.

FIG. 3B is a front view of an example embodiment of the invention showing a gang bar assembly, in the locked position, installed onto watthour meter boxes.

FIG. 11A is a top view of the inline configuration of an example embodiment of the invention showing a coupling member assembly and the enclosure locking member.

FIG. 11B is a side view of the inline configuration of the coupling member assembly and the enclosure locking member.

FIG. 11C is a front view of the inline configuration of an example embodiment of the invention showing a coupling member assembly and the enclosure locking member.

FIG. 34A is a perspective view of the vertical tube assembly with horizontal members arbitrarily positioned along tube axis.

FIG. 34B is a perspective view of tube showing index features that abuts the meter box lids when entire gang bar assembly is properly attached to a gang of meter boxes.

FIG. 34C is a perspective view of the horizontal member assembly showing the side that abuts to a meter box lid when entire gang bar assembly is properly attached to a gang of meter boxes.

FIG. 34D is an exploded view of assembly components comprising horizontal member assembly depicted in FIG. 34C.

FIG. 34E is another exploded view of assembly components comprising horizontal member assembly depicted in FIG. 34C.

FIGS. 35A-35D5 include various views of embodiments including certain members, components, structures, and configurations in accord with possible embodiments of the invention.

FIG. 35A1 is a perspective of a low-profile housing, receiver and receiver screw assembled.

FIG. 35A2 is a perspective of a low-profile housing, receiver and assembly tool with socket headed cap screw.

FIG. 35C is a perspective of a low-profile housing, receiver and assembly tool with socket headed cap screw with typical hole punch device.

FIG. 35D1-35D5 includes perspectives of an assembly tool with socket headed cap screw; a low-profile housing attached to top of meter box enclosure; a low-profile housing, receiver and receiver screw assembled; a low-profile attached to bottom of meter box enclosure with use of spacer (Lock is not inserted. Gang bar attachment shown); a low-profile housing.

Figure 1:
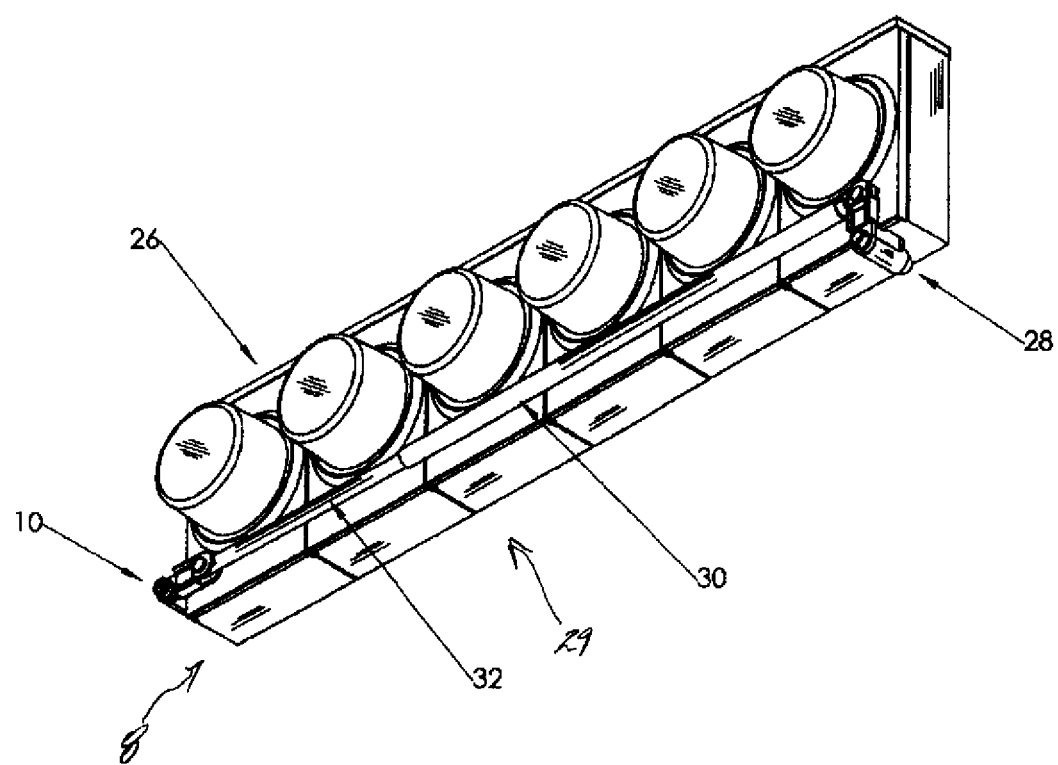
FIG. 1 is a perspective view of an example embodiment of the invention showing a gang bar assembly, in the locked mode or position, installed onto watthour meter boxes.

While various example embodiments of the invention will be described herein, it will be understood that it is not intended to limit the invention to those embodiments. On the contrary, it is intended to cover all alternatives, modifications, and equivalents included within the spirit of the invention.

DETAILED DESCRIPTION OF THE INVENTION

Turning now descriptively to the drawings, in which similar reference characters may denote similar elements throughout the several views, the attached figures illustrate a securing apparatus for preventing access to a gang of watthour meter boxes 26. Referring to FIGS. 1-3A-3C, the securing apparatus 8 shown installed onto a gang of watthour meter boxes 26.

Referring in more detail to FIGS. 1-3A-3C as well as to FIGS. 4A-6, in an example embodiment, the securing apparatus 8 is adapted to be mounted to secure a plurality of electric meter boxes. In one embodiment, the securing apparatus 8 comprises first and second enclosure locking members 10, 28, a securing member 29 having first and second ends with the securing member comprising a securing bar 30, 32, and first and second coupling members (e.g., see items 22/20, FIG. 4B) with each being moveably (in some embodiments pivotally or rotatably) attachable proximal the distal ends of the securing bar. In an example embodiment, the coupling members are separably and slidably mateable with an extended member or mating portion, or bracket arm of each of respective first and second enclosure locking members 10, 28. It should also be noted that enclosure locking members 10, 28 may have an identical configuration in some embodiments or different in other embodiments.

Referring again to the example embodiment illustrated in FIG. 1, the securing member (or for example, gang bar assembly) is shown with the enclosure locking member 10 installed onto a gang of watthour meter boxes 26 where one interconnected coupling member assembly (including the coupling member and fasteners) and its respective enclosure locking member 10 is oriented substantially in line with the securing bar (or telescopic tube assembly) 30, 32 and the other interconnected coupling member assembly (including the coupling member and fasteners) and its respective enclosure locking member 28 is oriented substantially perpendicular to the telescopic tube assembly. This configuration shows the securing apparatus attached at the bottom of the gang of watthour meter boxes. In other examples however, it could be attached at the top of the gang of watthour meter boxes as will be described further hereinafter.

Figure 2:
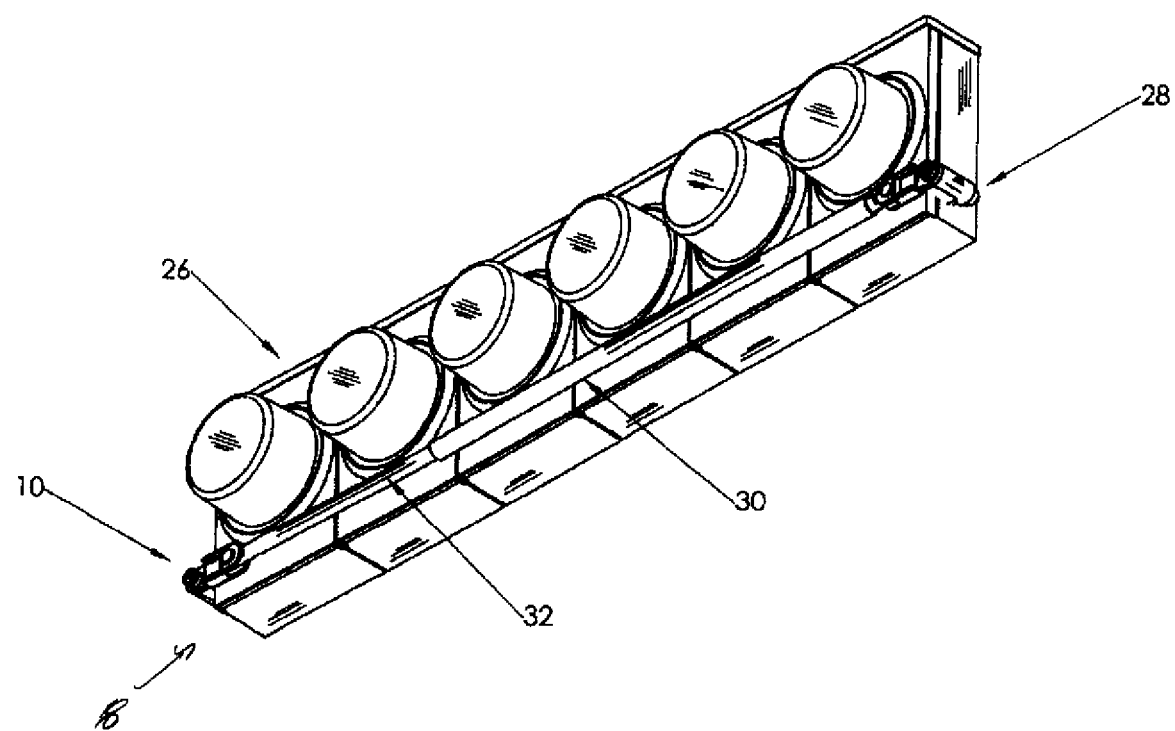
FIG. 2 is a perspective view of an example embodiment of the invention showing a gang bar assembly, in the locked position, installed onto watthour meter boxes.
Figure 3C:
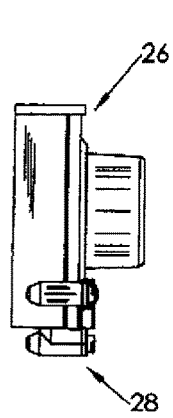
FIG. 3C is a bottom view of an example embodiment of the invention showing a gang bar assembly, in the locked position, installed onto watthour meter boxes.
Figure 3C:
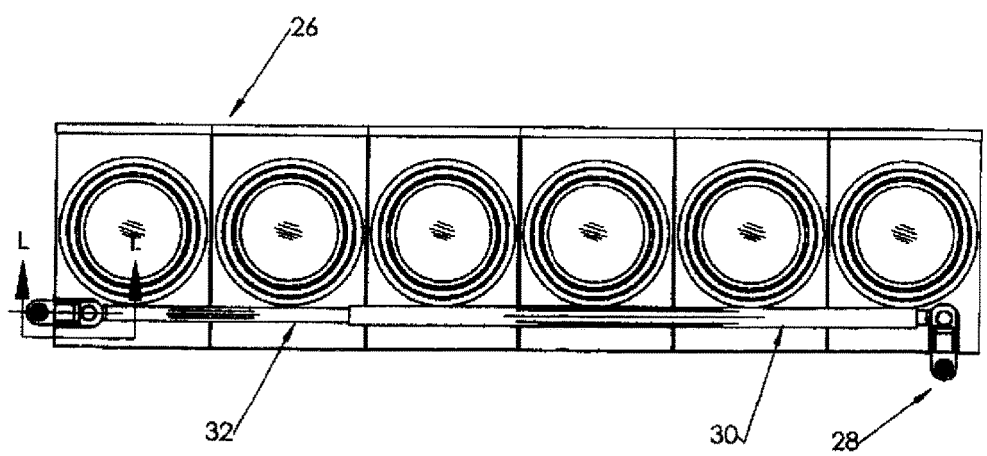
Figure 3C:
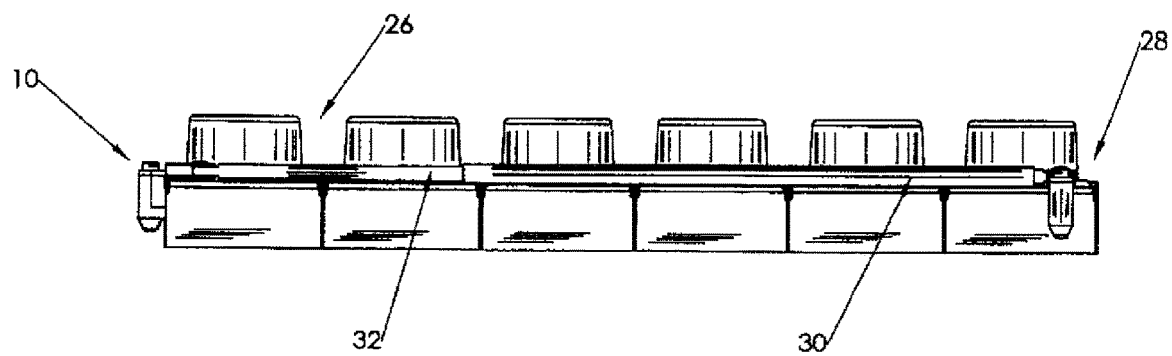

FIG. 2 shows an example embodiment with the enclosure locking members of the securing apparatus 8 (or in some embodiments, gang bar assembly) installed onto a gang of watthour meter boxes where both the coupling member assemblies and enclosure locking members 10, 28 are substantially, oriented axially in line with the longitudinal axis of the telescopic tube assembly. This configuration shows the gang bar attached at the bottom of the gang of watthour meter boxes but, in another example embodiment, it could also be attached at the top of the gang of watthour meter boxes.

Figure 4A:
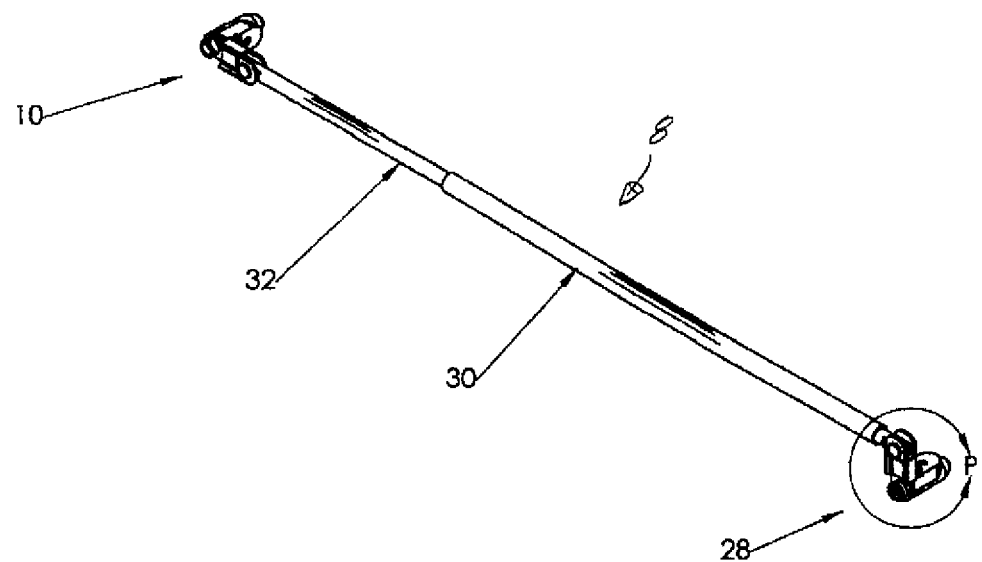
FIG. 4A is a perspective view of an example embodiment of the invention showing a gang bar assembly without the watthour meter boxes.
Figure 4B:
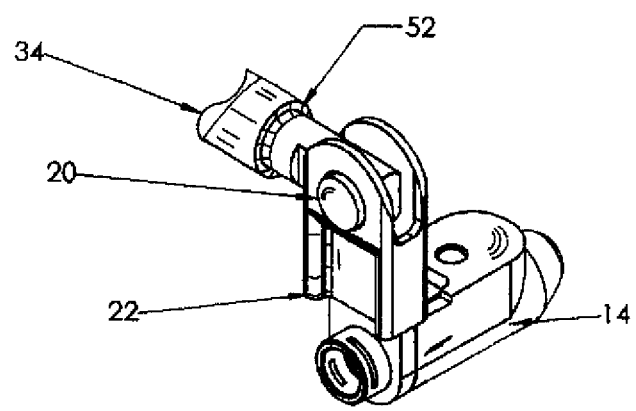
FIG. 4B is a perspective view of an example embodiment of the invention showing a coupling member subassembly of the gang bar showing an example of a weld embodiment.
Figure 5:
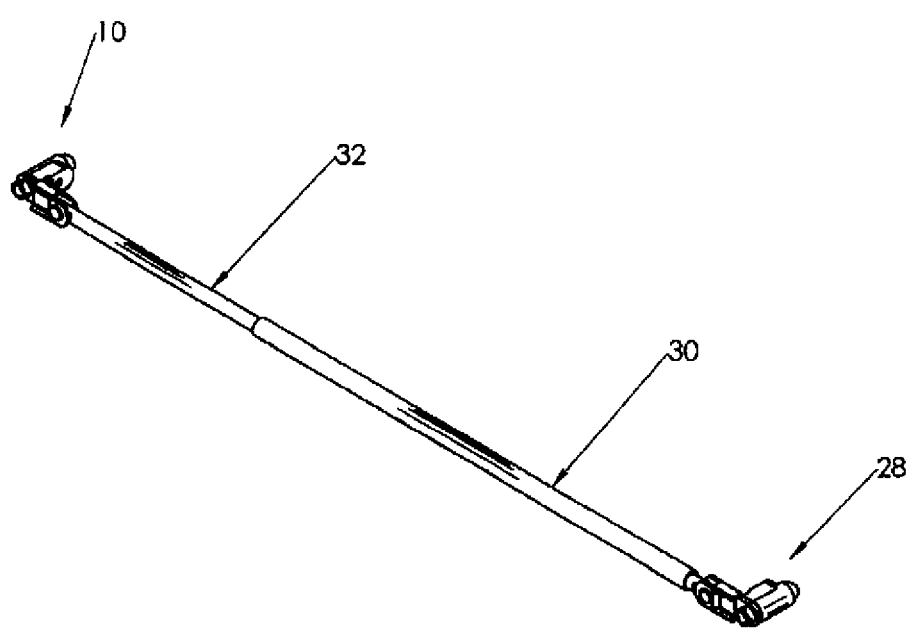
FIG. 5 is a perspective view of an example embodiment of the invention showing a gang bar assembly without the watthour meter boxes.

In the example embodiments shown in FIGS. 4A-4B and FIG. 5, the securing apparatus with the enclosure locking members 10, 28 are in different configurations. It can be seen that the telescopic tube assembly 30, 32 is configured in such a way that the overall length of the gang bar assembly can be changed by adjusting the relative position of the tube 30 with respect to rod 32 so as to secure meters of different gang size.

Figure 6:
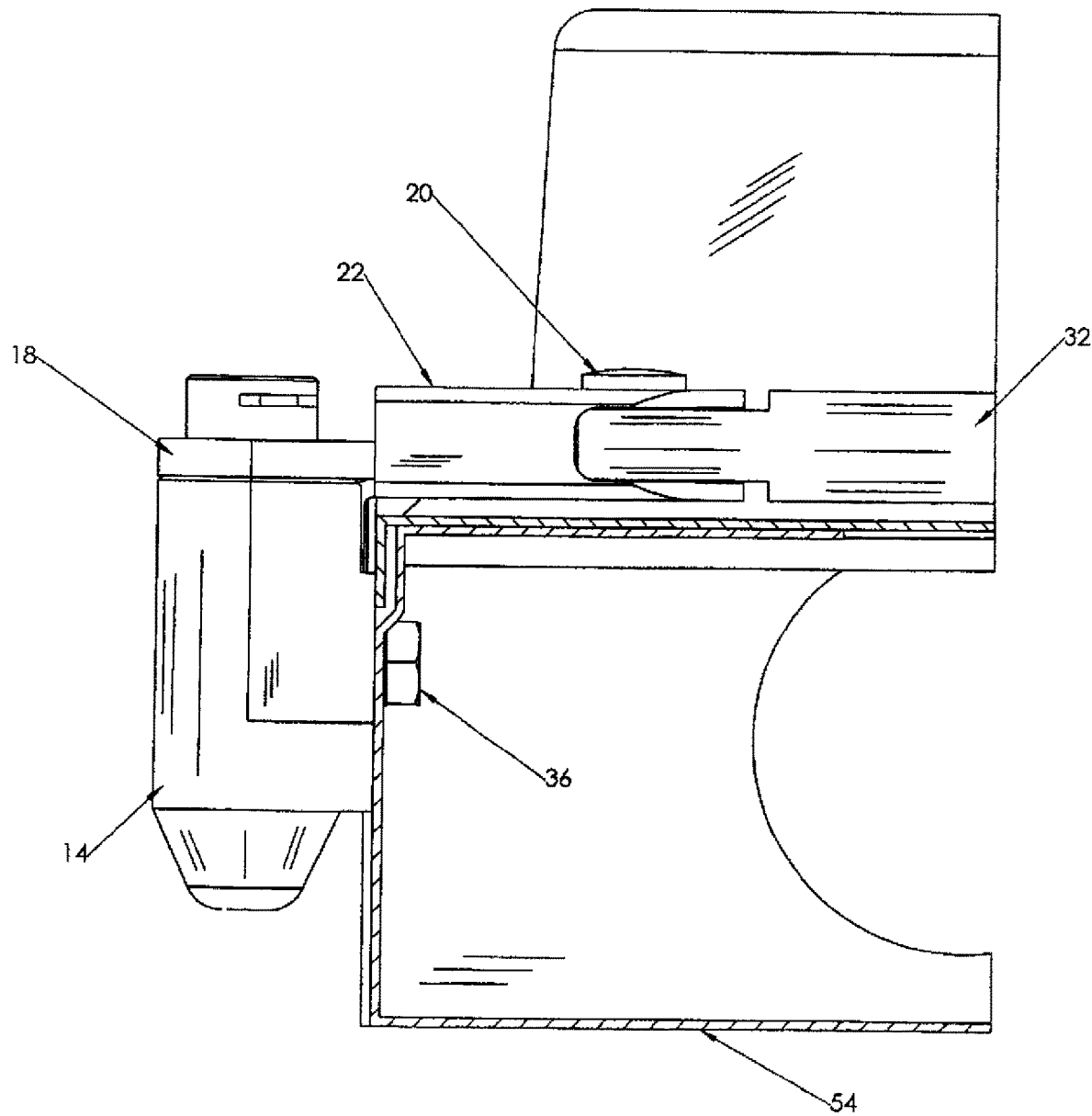
FIG. 6 is a sectional view of an example embodiment of the invention showing engagement of the enclosure locking member to the watthour meter box viewed from below.

FIG. 6 illustrates and example embodiment and shows a cross-sectional view showing the enclosure locking member 12 mounted and engaged to the meter box 54 via a screw 36 (or bolt).

Figure 7:
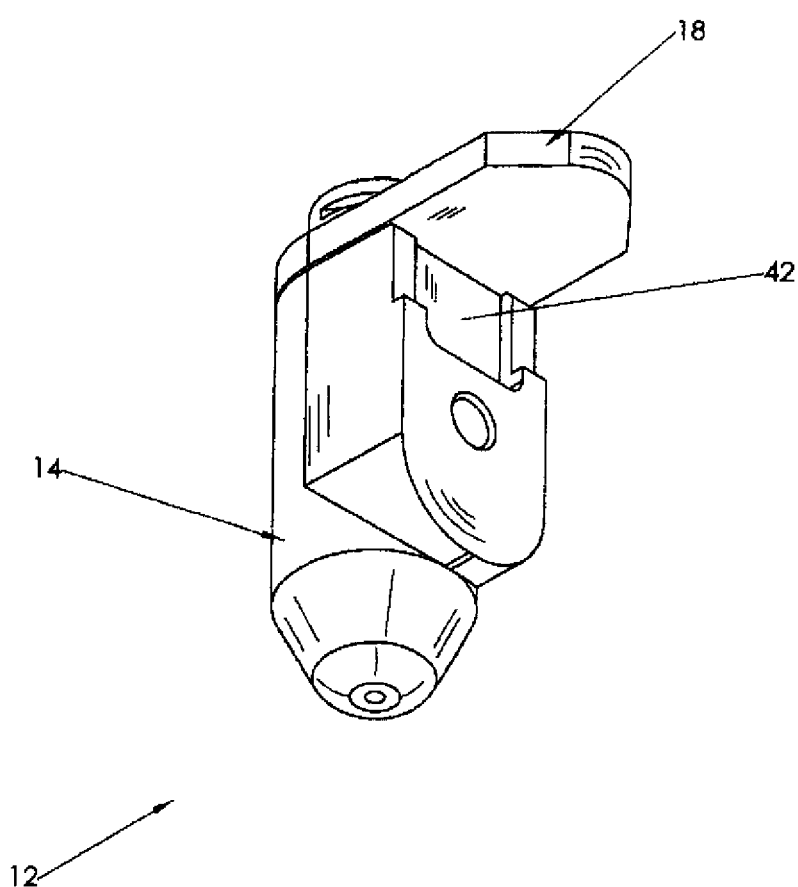
FIG. 7 is a perspective view of an example embodiment of the invention showing an enclosure locking member assembly.
Figure 8A:
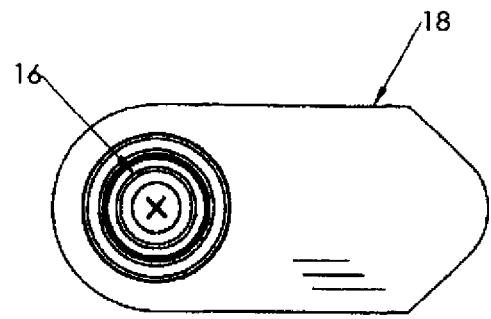
FIG. 8A is a top view of an example embodiment of the invention showing an enclosure locking member assembly.
Figure 8B:
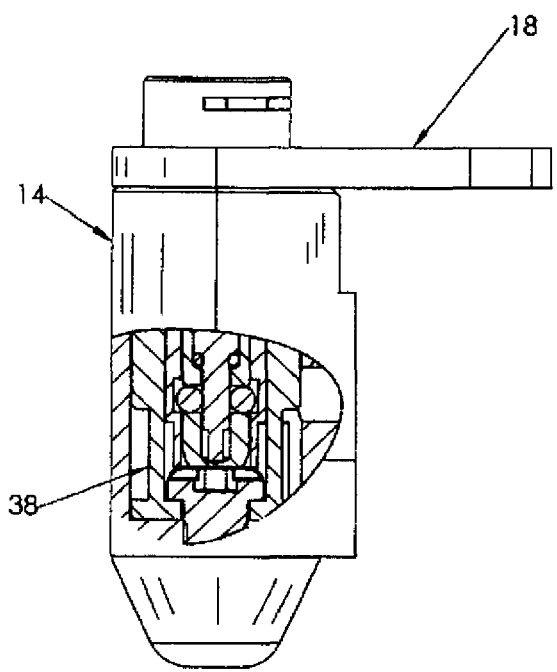
FIG. 8B is a broken out section front view of an example embodiment of the invention showing an enclosure locking member assembly.
Figure 8C:
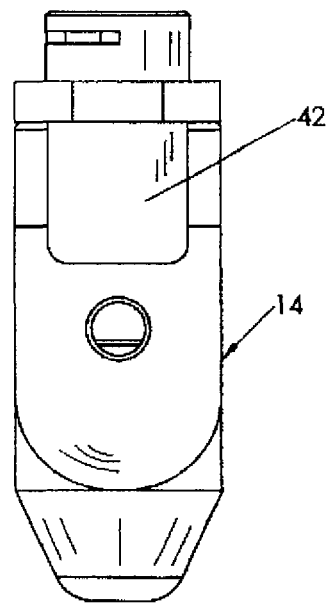
FIG. 8C is a side view of an example embodiment of the invention showing an enclosure locking member assembly.

Other view of example embodiments are provided in FIGS. 7-8. Various features of the enclosure locking member 12 are shown, including, for example, an extrude cut or recess feature 42 which receives the bent tab of the coupling member 40; FIG. 8B is a broken out sectional view illustrating the sleeve 38 and lock 16 inside the enclosure locking device. Various views of example embodiments are also provided in FIGS. 9-12 illustrating configurations of the coupling member assembly with the coupling member assembly 10 oriented substantially in-line with the telescopic tube assembly. In addition, FIGS. 13-16 show the various views of the configurations of the coupling member assembly where the coupling member assembly 28 is oriented substantially perpendicular to the telescopic tube assembly.

Figure 16:
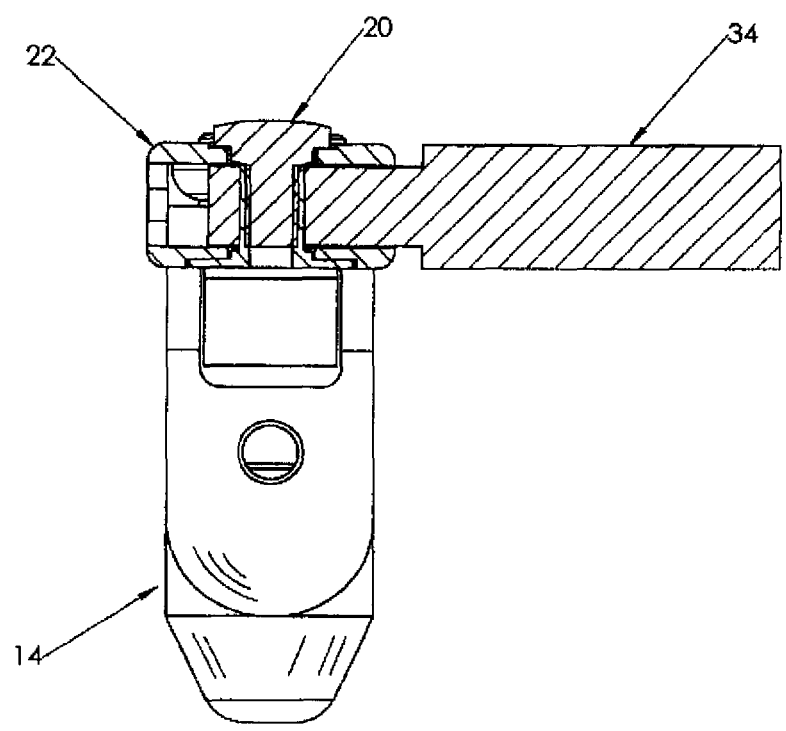
FIG. 16 is a sectional front view of the perpendicular configuration of an example embodiment of the invention showing a coupling member assembly and the enclosure locking member.

The telescopic tube assembly, referred to as such in some example embodiments, consists of a tube 30 and a rod 32. The rod is connected to one of the coupling member assemblies 10 directly as shown in FIGS. 9-12, in some example embodiments, and the tube is connected to the other coupling member assembly 28 thru a rod 34 as shown in FIGS. 13-16 which, in some embodiments, is welded 54 to the tube 30 as shown in FIG. 4B, although other forms of attachment known to a person of ordinary skill in the art may also be used. FIG. 12 and FIG. 16 are the sectional views showing the mating of the parts of the coupling member assembly. FIGS. 9-16 show the different parts of the coupling member assembly which are the coupling member 22, the square head screw 20 and the barrel nut 24. The square head screw 22 and the barrel nut 24 help in creating a "pivot" joint between the coupling member 22 and the telescopic tube assembly which enables different configurations (e.g., inline and perpendicular). In an example embodiment shown in FIG. 6, the enclosure locking member housings 14 are connected to the watt hour meter boxes 54 using a screw 36. The pivot arm 18 of the enclosure locking members 12 is inserted into the coupling members 22 receiving cavity of the gang bar in the appropriate configurations. The locks 16 are then inserted into the enclosure locking member housing 14. Thus, the bent tab 40 of the coupling member 22 is trapped with the cut feature 42 on the enclosure locking member housing 14 by the pivot arm 18 and the meter box 54. In this way, the completed assembly secures the gang of watthour meters 26 from unauthorized access. It will be appreciated that the lock is used in some embodiments to block access to the housing screw (providing a further anti-tampering feature) in the housing cavity or recess of the enclosure locking member.

Figure 17:
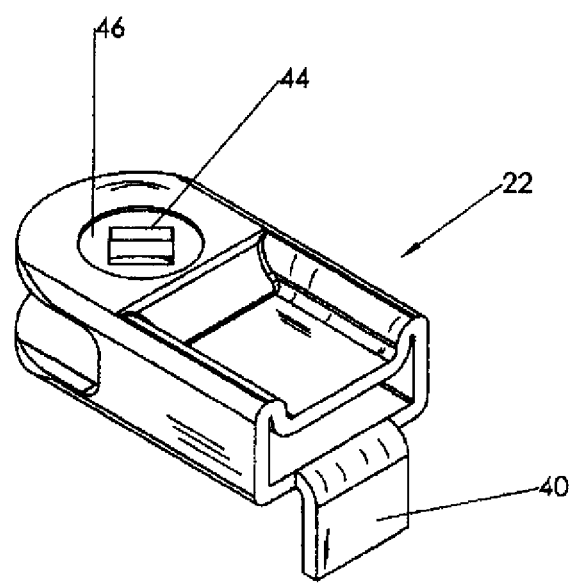
FIG. 17 is a perspective view of an example embodiment of the invention showing a coupling member.
Figure 18A:
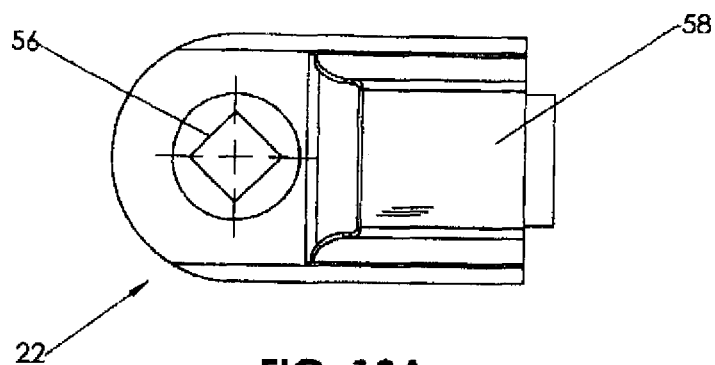
FIG. 18A is a top view of an example embodiment of the invention showing a coupling member.
Figure 18B:
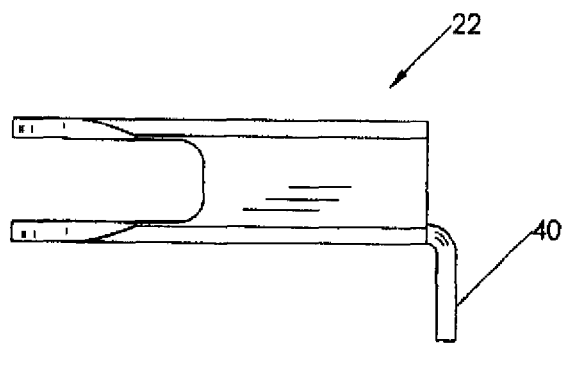
FIG. 18B is a front view of an example embodiment of the invention showing a coupling member.
Figure 18C:
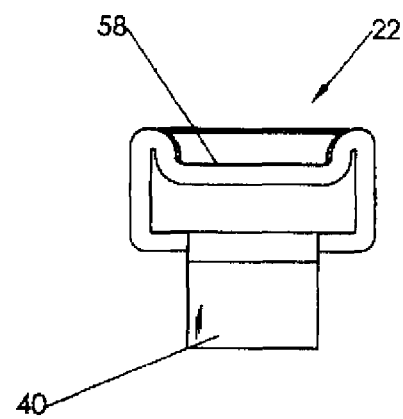
FIG. 18C is a side view of an example embodiment of the invention showing a coupling member.
Figure 18D:
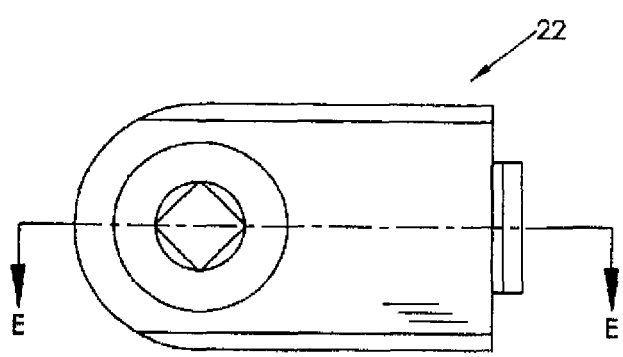
FIG. 18D is a bottom view of an example embodiment of the invention showing a coupling member.
Figure 19:
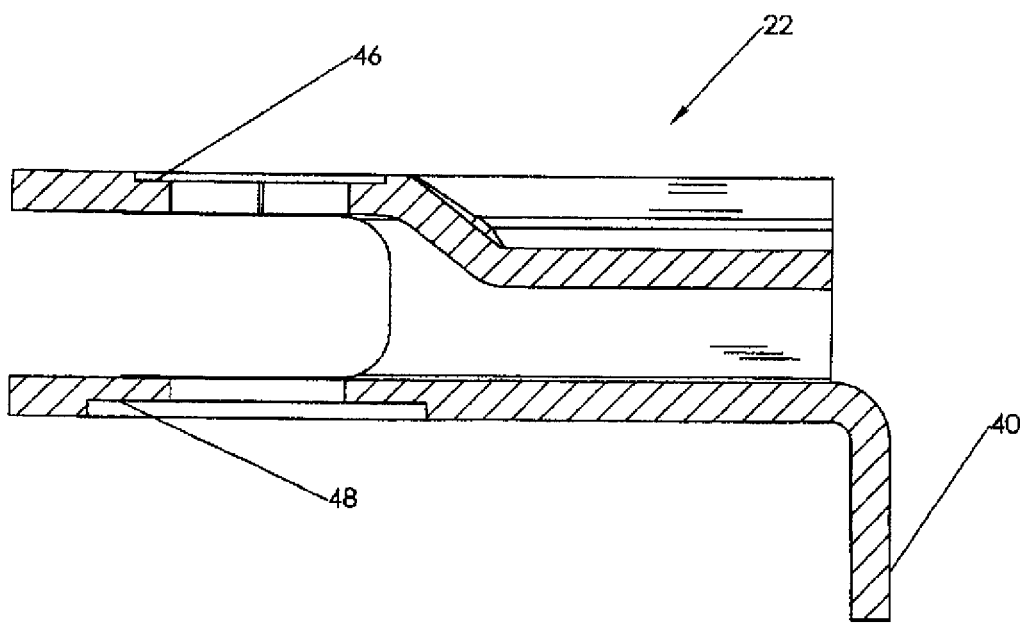
FIG. 19 is a sectional view of an example embodiment of the invention showing a coupling member.

Referring now to FIGS. 17-19, various views of the coupling member 22 are shown. The square hole 56 on one side of the coupling member is designed as an anti-rotational feature so as to prevent the rotation of the square head screw 20. As a further anti-tampering feature, this eliminates the possibility of unscrewing the fastener if the securing apparatus (or the gang bar) is being tampered with or attacked. The counter bores 46, 48 for the square head screw 20 and the barrel nut 24 are designed so as to eliminate the possibility of attack below their heads. The coupling member 22 forms feature 58 on one side which aids in preventing any attack by more securely encasing pivot arm 18 of the enclosure locking member 12 and also helps in the installation of the gang bar as it aligns and restricts the direction of installation process.

Figure 20:
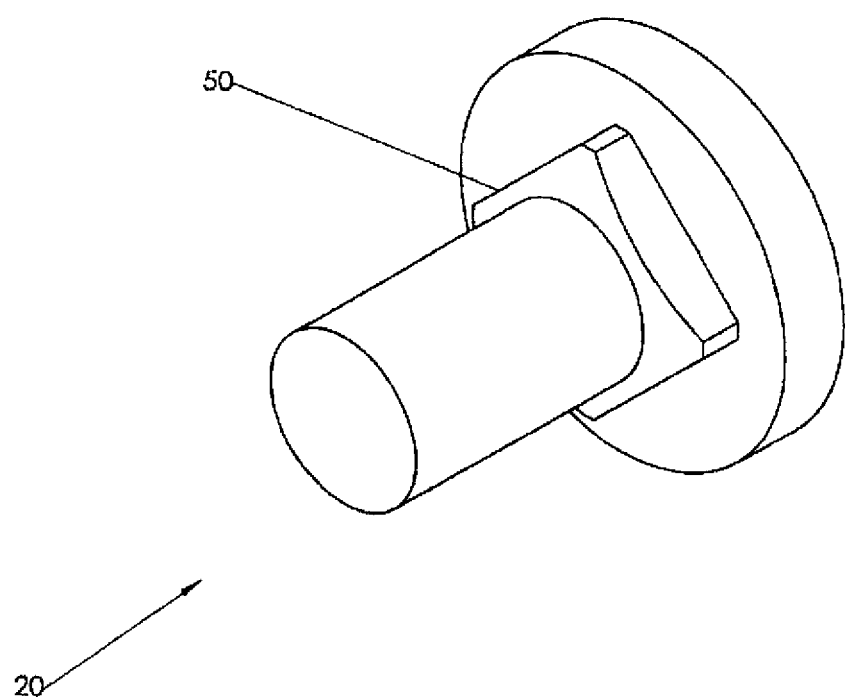
FIG. 20 is a perspective view of an example embodiment of the invention showing a square head screw.
Figure 20:
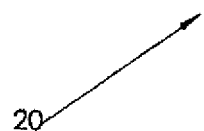

Referring generally to FIGS. 1-20, an example embodiment of the present invention comprises an enclosure locking member 12, and a securing member, wherein the enclosure locking member comprises a bracket arm 18 which comprises an extended flange and a housing 14 comprising a recess 42, and a receiving bore, and wherein the enclosure locking member 12 further comprises a housing screw (disposed proximate the end opposite the receiving bore opening of the enclosure locking member housing, being disposed for releaseably affixing the bracket arm with respect to the housing 14), attaching screw 36, and, in some example embodiments, a lock 16 (which may be a specially configured and modified lock for use with conventional locking devices (such as barrel or plunger locks or any other suitable conventional locking device) or adapted for use with complementarily adapted or modified locking systems (e.g., of DeWalch Technologies) including barrel or plunger locks and attaching hardware (e.g., such as DeWalch Side or Bottom ProLocks or Armadillo Locking hardware (for example, see U.S. Pat. Nos. 7,176,376, and 5,870,911, and application Ser. No. 12/317,086 and also REFERENCES section below)), and wherein the securing member comprises a securing bar (which, in some embodiments has an adjustable, variable length and comprises a telescoping rod and tube 30, 32, and, in other example embodiments, comprises only a rod), and wherein the securing member comprises a coupling member (e.g., either or both 10, 28, for example, in FIG. 1) which comprises, in some embodiments, a first flange 22A, second flange 22B (e.g., FIG. 10), receiving cavity, opening, and tab, and wherein the securing member further comprises a barrel nut and a carriage bolt, 20, 24 or other suitable fastening system, structure, or arrangement. FIG. 20 shows the square head 50 of the fastener.

Another example embodiment comprises an enclosure locking member 12, and a securing member (in some example embodiments comprising 10, 32, 30, 28), wherein the enclosure locking member comprises a bracket arm 18 which comprises an extended flange and a housing 14 (the housing, in some embodiments (e.g., similar to a portion of a DeWalch Technologies product referred to as the Armadillo, U.S. Pat. No. 5,870,911) comprising a recess, and a receiving bore), and wherein the enclosure locking member further comprises a housing screw, attaching screw, and, in some example embodiments, a lock (which may be a specially configured or conventional barrel or plunger lock), and wherein the securing member comprises a securing bar (which comprises a rod and tube (extendable) 30, 32 (in some example embodiments) or only a rod (in some or other example embodiments), and wherein the securing member comprises a coupling member (or a link in some embodiments) (and in some embodiments, first and second coupling members 10, 28), wherein the coupling member comprises a flange 1, flange 2, receiving cavity, opening (or through hole), and tab, and wherein the securing member further comprises a barrel nut (e.g., or sex nut or other suitable fastening structure) and a carriage bolt, and wherein the receiving cavity is adapted to rotatably (or translationally) receive the extended flange of the bracket arm to engage the securing member to the enclosure locking member (see for example, some embodiments shown in FIGS. 11E-11G), and wherein a suitable locking device can be inserted into the bracket arm to cooperatively prevent tampering with the housing screw.

Figure 9:
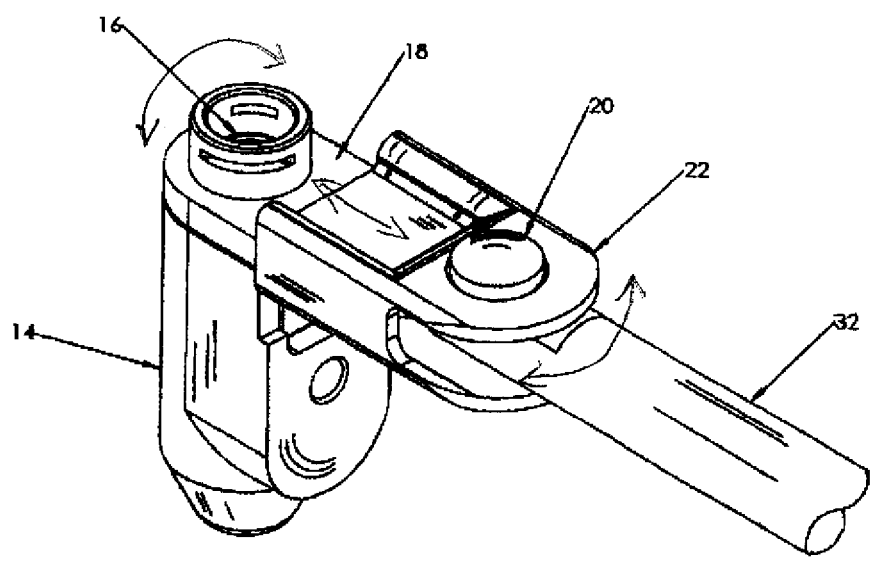
FIG. 9 is a perspective view of the inline configuration of an example embodiment of the invention showing a coupling member assembly and the enclosure locking member in the "locked" position.
Figure 10:
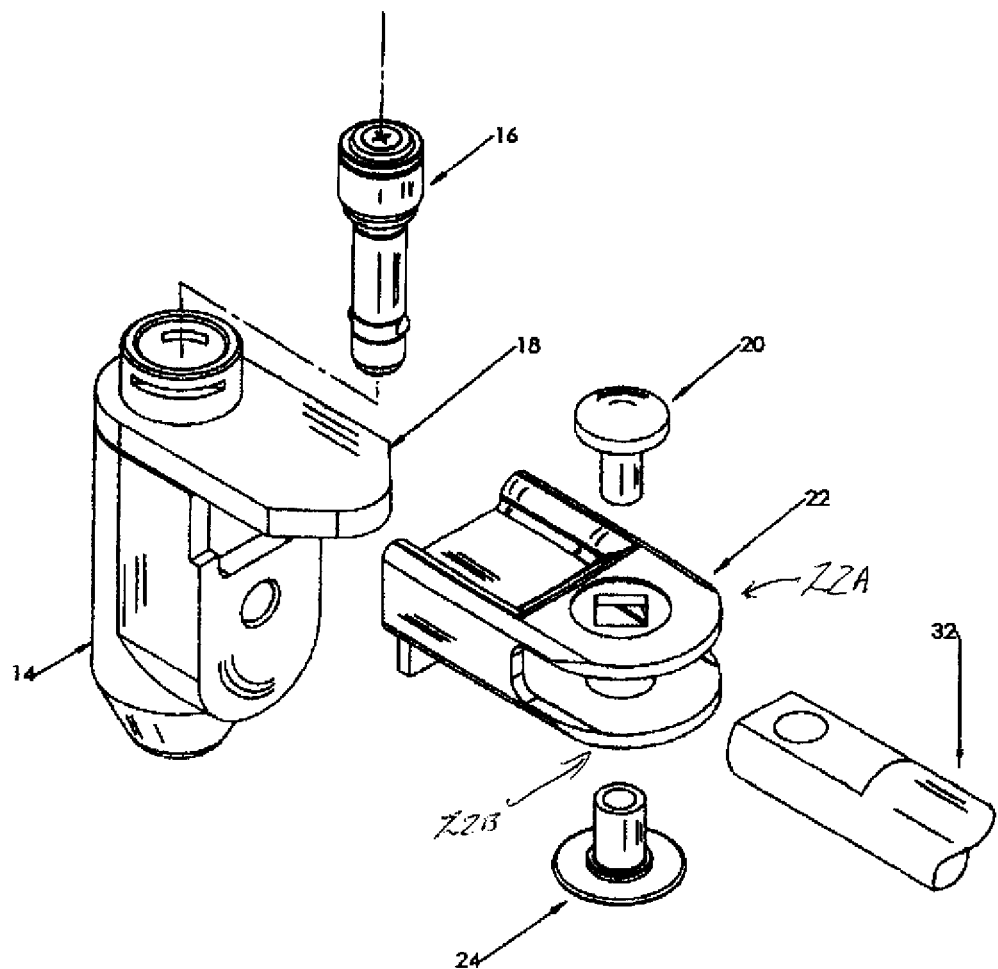
FIG. 10 is an exploded view of the inline configuration of an example embodiment of the invention showing a coupling member assembly and the enclosure locking member.
Figure 14:
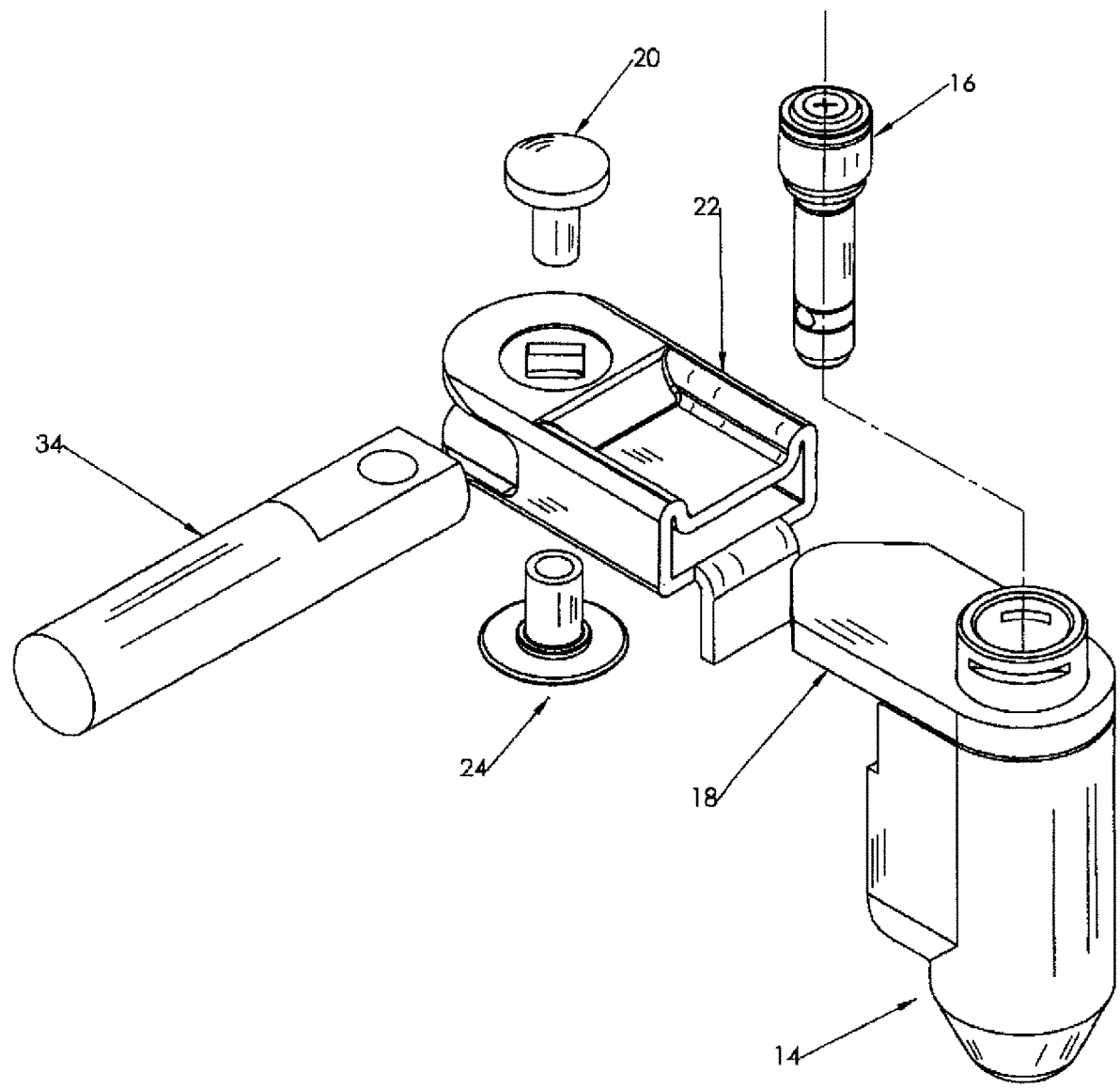
FIG. 14 is an exploded view of the substantially perpendicular configuration of an example embodiment of the invention showing a coupling member assembly and the enclosure locking member.
Figure 15A:
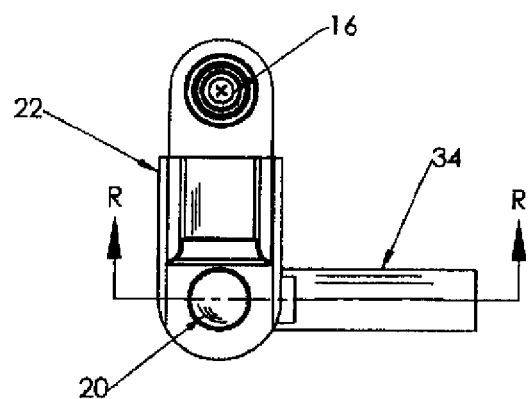
FIG. 15A is a top view of the substantially perpendicular configuration of an example embodiment of the invention showing a coupling member assembly and the enclosure locking member.
Figure 15B:
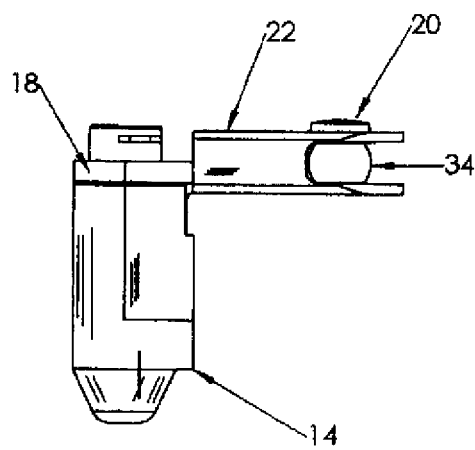
FIG. 15B is a side view of the substantially perpendicular configuration of an example embodiment of the invention showing a coupling member assembly and the enclosure locking member.
Figure 15C:
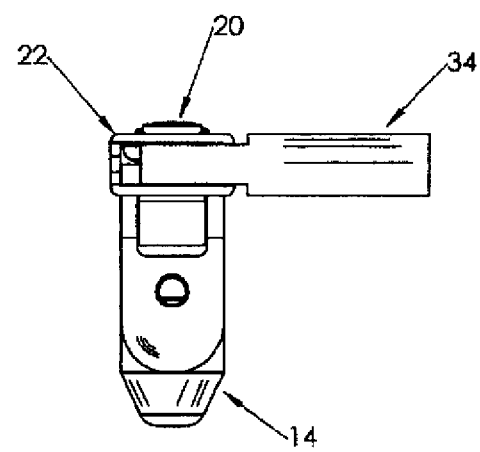
FIG. 15C is a front view of the substantially perpendicular configuration (which would be oriented differently in other embodiments) of an example embodiment of the invention showing a coupling member assembly and the enclosure locking member.

In one example embodiment, enclosure locking member 12 comprises a housing 14 into which a bracket arm 18 is inserted into a receiving bore and fastened with a housing screw for which mating counter rotation features ensure immobility of components. Referring generally to FIGS. 9, 10, and 14, a lock 16 (e.g., a barrel lock in one embodiment) is coaxially insertable along the same axis as the housing screw. When the lock is actuated and locked, access to the screw is secured from tampering. The housing is attached to the enclosure, in one embodiment, with an attaching screw that passes through a punched hole in the enclosure (e.g., 54 in FIG. 6). The attaching screw head is preferably accessible only from inside the enclosure, thereby, ensuring access only when the enclosure is open. Often this arrangement is further fortified by placing a thick fortification plate with an opening (or through hole) on the inside of box which may be included in the attaching screw assembly. Sometimes this fortification plate has a 90-degree bend to structurally reinforce the corner of the enclosure and provide additional mechanical advantage to the assembly when attacked.

As noted herein, in another example embodiment, the securing apparatus comprises just the coupling member and securing member (without the enclosure locking member(s)) and may be universally useable and interchangeable with other devices similar to the enclosure locking members which would serve as attaching structures.

Figure 27A:
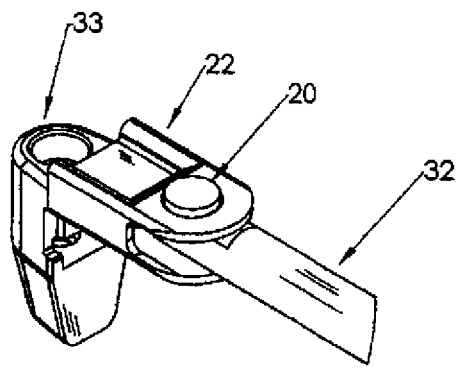
Figure 27B:
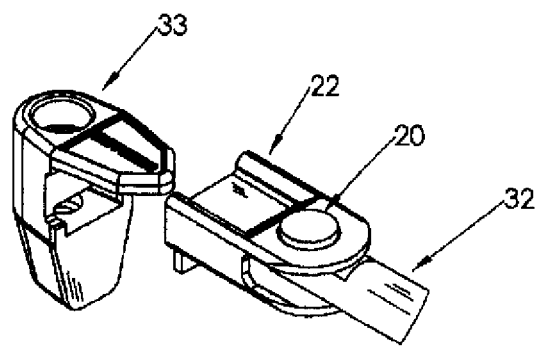

In an alternate embodiment, the enclosure locking member is a single body component that attaches to an enclosure with a bracket mechanism and a lock (e.g. used with DeWalch Technologies, Side or Bottom ProLock devices) (being reconfigured and having complementary engageable structures) (a portion of which is shown generally in FIGS. 27A and 27B and further described herein). The bracket replaces the need for making a hole through the enclosure and eliminates the attaching screw.

Regarding the enclosure locking member, the barrel lock, in some embodiments, is a common product used in the utility industry that conforms to two standard barrel lengths and a common diameter (and in some embodiments other lengths and sizes). Internal components and functionality varies by vendor and model to provide many varieties of keys to provide exclusive ability to open locks.

In an example embodiment, the securing member comprises a securing bar having first and second ends and further comprises first and second coupling members rotationally attached to the ends respectively. In another example embodiment, the securing member comprises a securing bar having first and second ends and further comprises a first coupling member rotationally attached to a given end of the securing bar.

The securing bar can be comprised of a single rod or a rod and tube as an extendible and retractable assembly. In the single rod embodiment, the rod has at each end a through hole or opening that is normal to and intersecting, in some embodiments, with the rod axis. In the rod and tube embodiment, the tube has fixed at one end a protruding rod having a through hole normal to and intersecting the rod axis. The rod slides within tube to both extend and retract allowing variable length adjustment as desired depending on, for example, the number of boxes to be secured.

The coupling member, in an example embodiment, has two flanges at one end that are of similar size and shape and have axially aligned through holes. A barrel nut (e.g., in some embodiments referred to as a sex nut) and carriage bolt join flanges 22A, 22B (e.g., FIG. 10) of the coupling member with the securing bar using through holes in the bar and flanges 22A, 22B. The configuration allows the rod to rotate freely about the coupling member. Each end of the securing bar, in an example embodiment, has this configuration. The barrel nut and carriage bolt components could be replaced with a rivet or other fastening mechanisms that offer significant structural strength and substantial bearing surface.

Thus, the coupling member and bar attachment is supported on two opposing flanges that are structurally supported by perpendicular walls (e.g., FIG. 10). This structural arrangement provides optimum stress and strain transfer throughout the securing apparatus when tampered with or challenged by an attack rather than allowing stress to localize at a narrow cross-section. The securing bar can rotate approximately 200 degrees (in some embodiments and varied in others) about the shared axis of the barrel nut and carriage bolt. At the opposing end of coupling member 22, a receiving cavity is formed that functionally receives the bracket or extended arm of an enclosure locking member (e.g., FIG. 10). The receiving cavity allows limited motion except along the insertion direction. Additionally, the formed cavity provides thickened walls to further enhance the structural strength of the coupling member. A tab on the coupling member, at same end as receiving cavity, nests within the recess of enclosure lock housing. The coupling member is securely attached to enclosure when the enclosure locking member is fixedly attached to enclosure, and the housing screw is secured, and when the bracket arm is inserted into coupling member cavity, and the coupling member tab is nested into the enclosure lock housing.

In another example embodiment, the securing apparatus cooperates with an alternate enclosure locking member configured similarly, except the housing screw is obviated. As such, secure attachment requires insertion of a lock.

It will also be recognized, in some example embodiments, when coupling members are attached at both ends of an enclosure gang, the securing bar spans the distance between coupling members and, thereby, mechanically interferes with opening enclosure lids or doors.

Figure 11D:
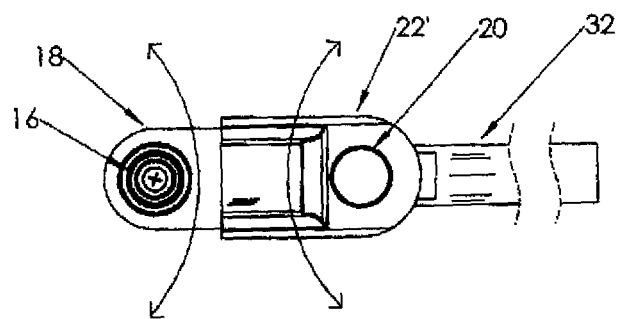
FIGS. 11D-11G illustrate example embodiments as described herein.
Figure 11E:
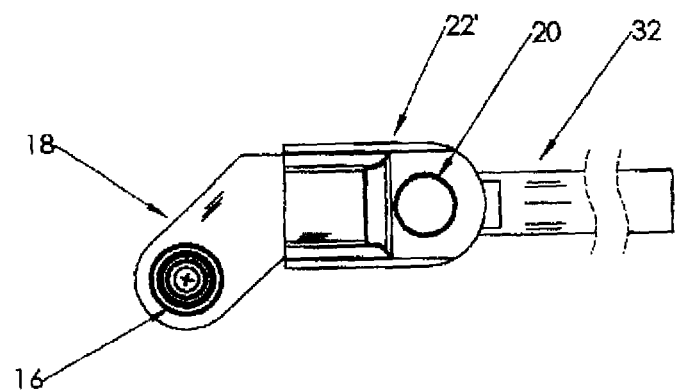
Figure 11F:
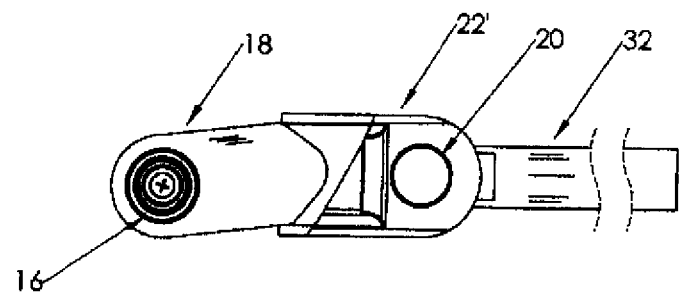
Figure 11G:
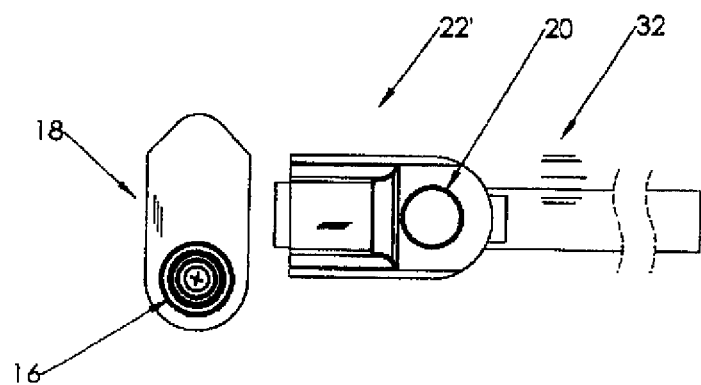
Figure 12:
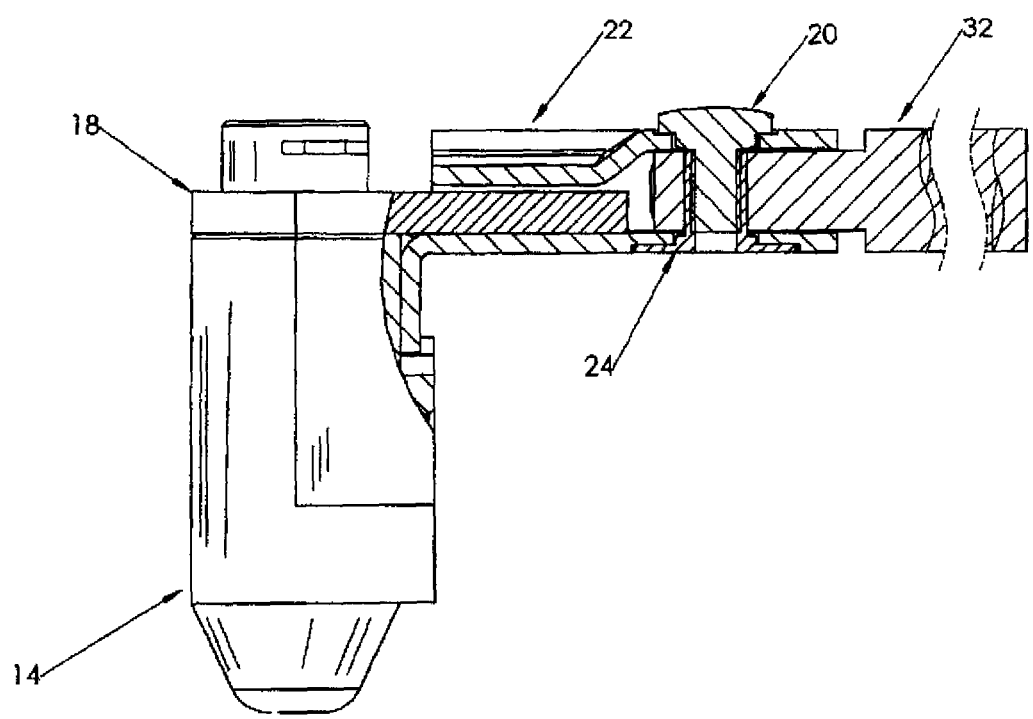
FIG. 12 is a broken out section front view of the in-line configuration of an example embodiment of the invention showing a coupling member assembly and the enclosure locking member.
Figure 13:
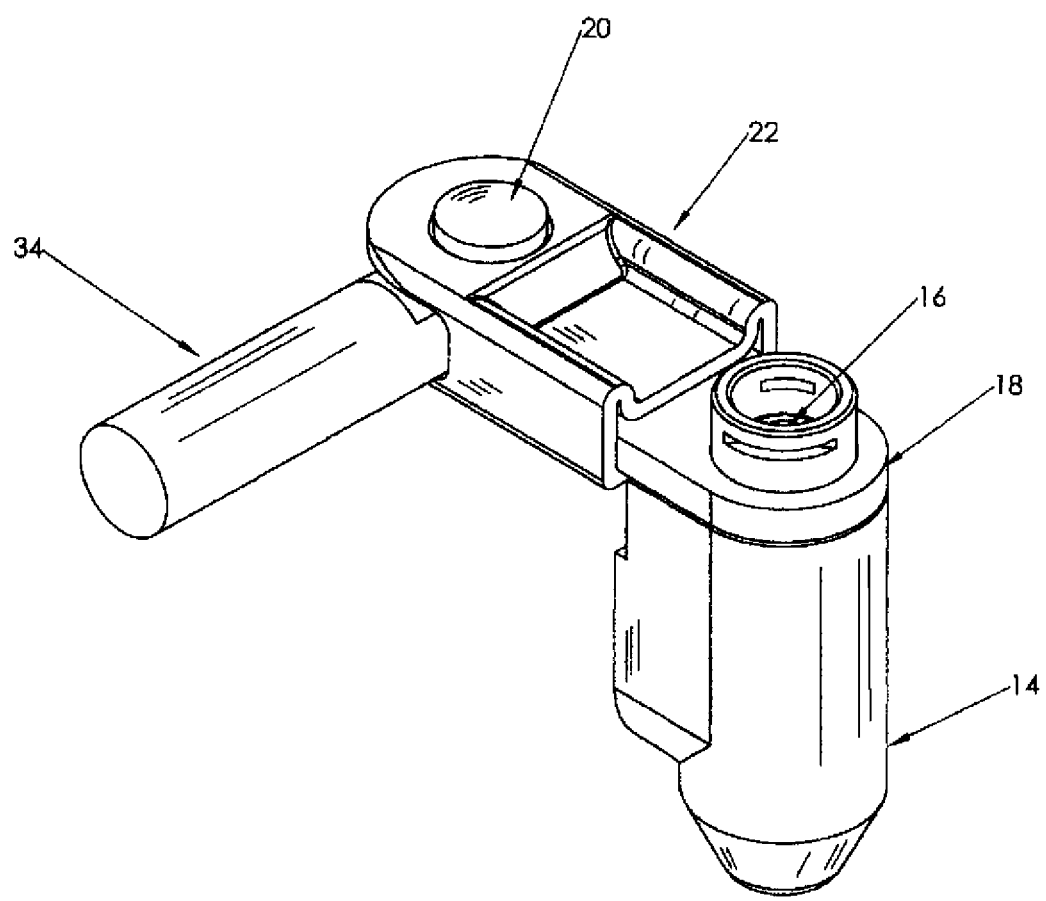
FIG. 13 is a perspective view of a substantially perpendicular configuration of an example embodiment of the invention showing a coupling member assembly and the enclosure locking member in the "locked" position or mode.

Turning now to FIG. 11D, another example embodiment is illustrated showing the two axes of relative rotational movement for coupling member 22' and extended flange 18. FIGS. 11D-G shows various radial positions of extended flange 18 relative to rotatable locking member 16. Coupling member 22' is an alternate embodiment of coupling member 22 with a wider receiving cavity 25' to allow 18 to rotate in and out of cavity 25' without having to fully remove enclosure lock extended flange 18 from enclosure lock housing 16. FIG. 11D shows coupling member 22' fully engaged within lock extended flange 18. FIG. 11G shows coupling member 22' fully removed from lock extended flange 18. FIGS. 11E-F shows the progression of relative motion and retraction of extended flange 18 from coupling member 22'.

Figure 21:
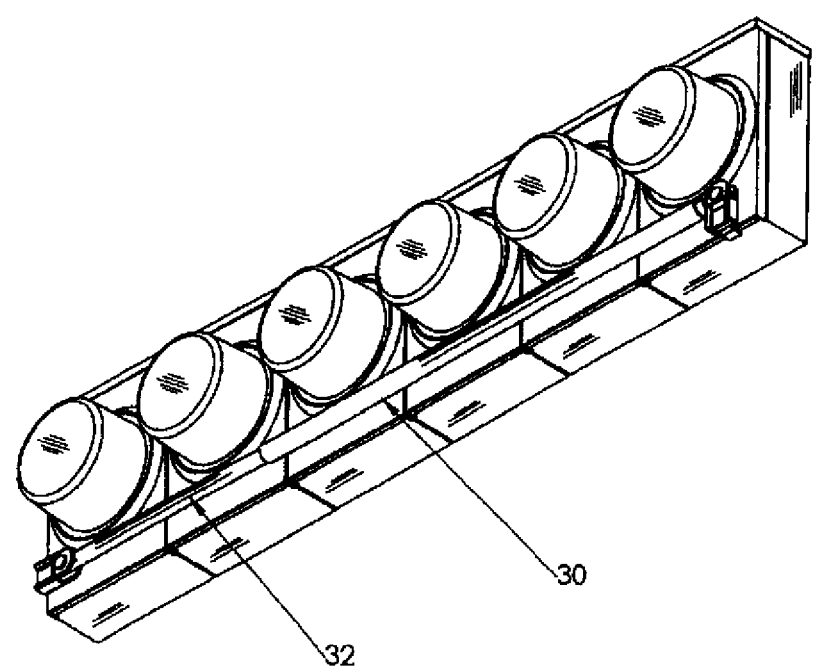
FIGS. 21-24 illustrate example embodiments as described herein.
Figure 22:
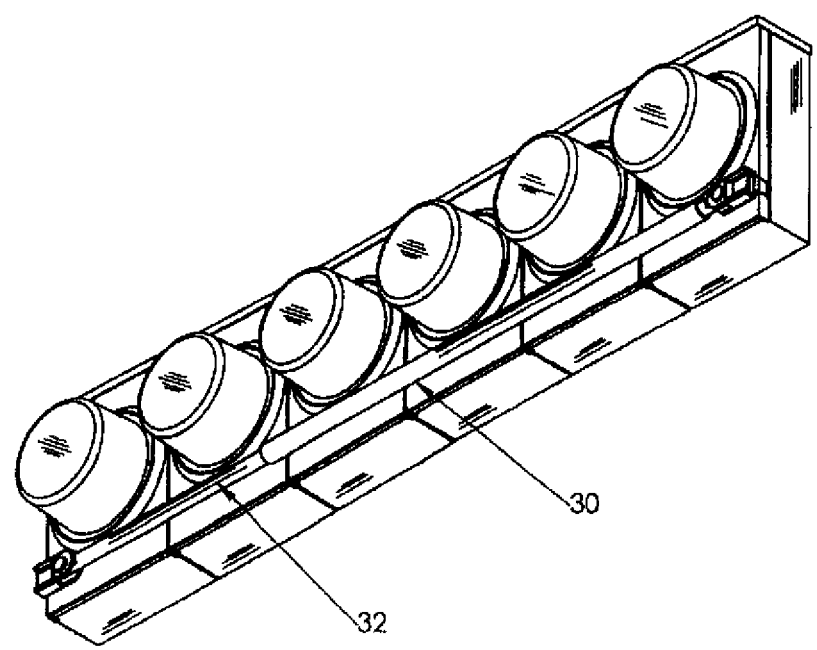
Figure 23A:
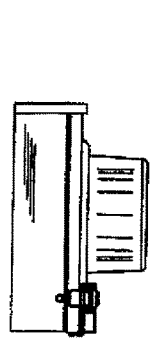
Figure 23B:
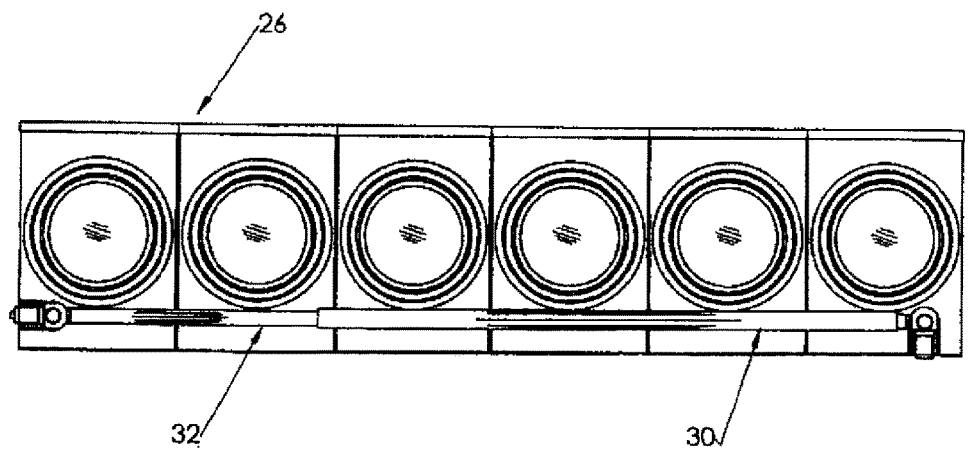
Figure 23C:
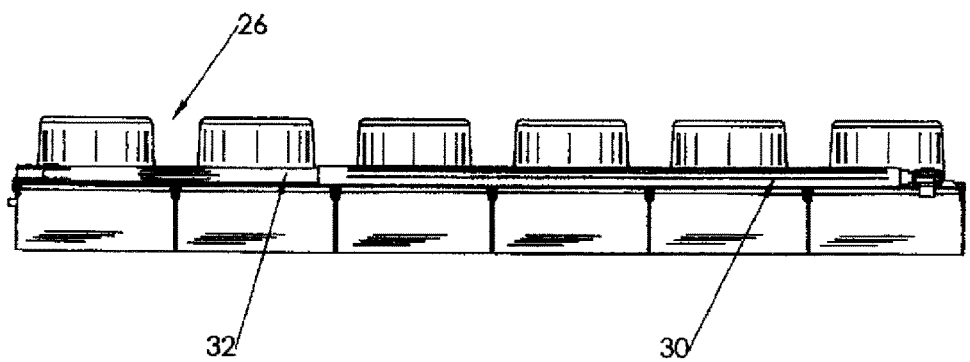
Figure 24:
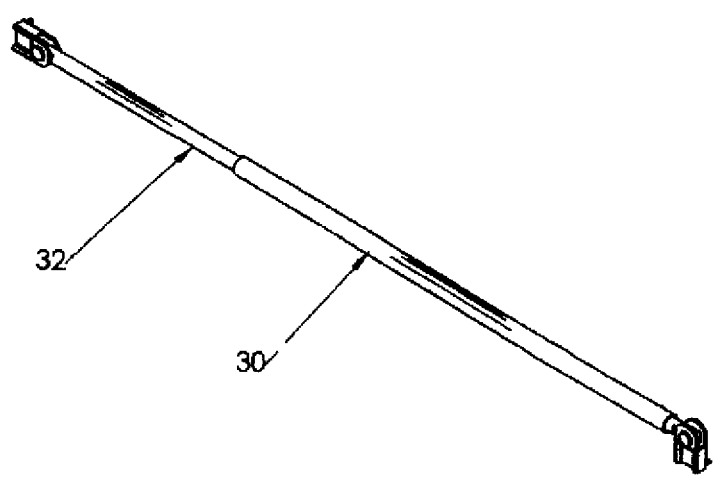
Figure 25:
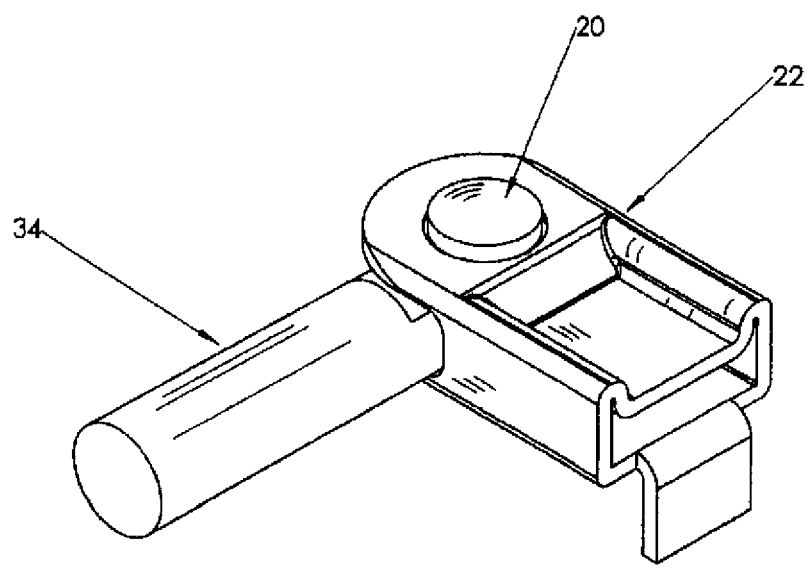
FIGS. 25-30B illustrate example embodiments as described herein.
Figure 26:
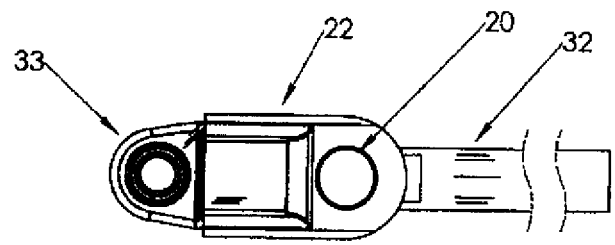
Figure 28:
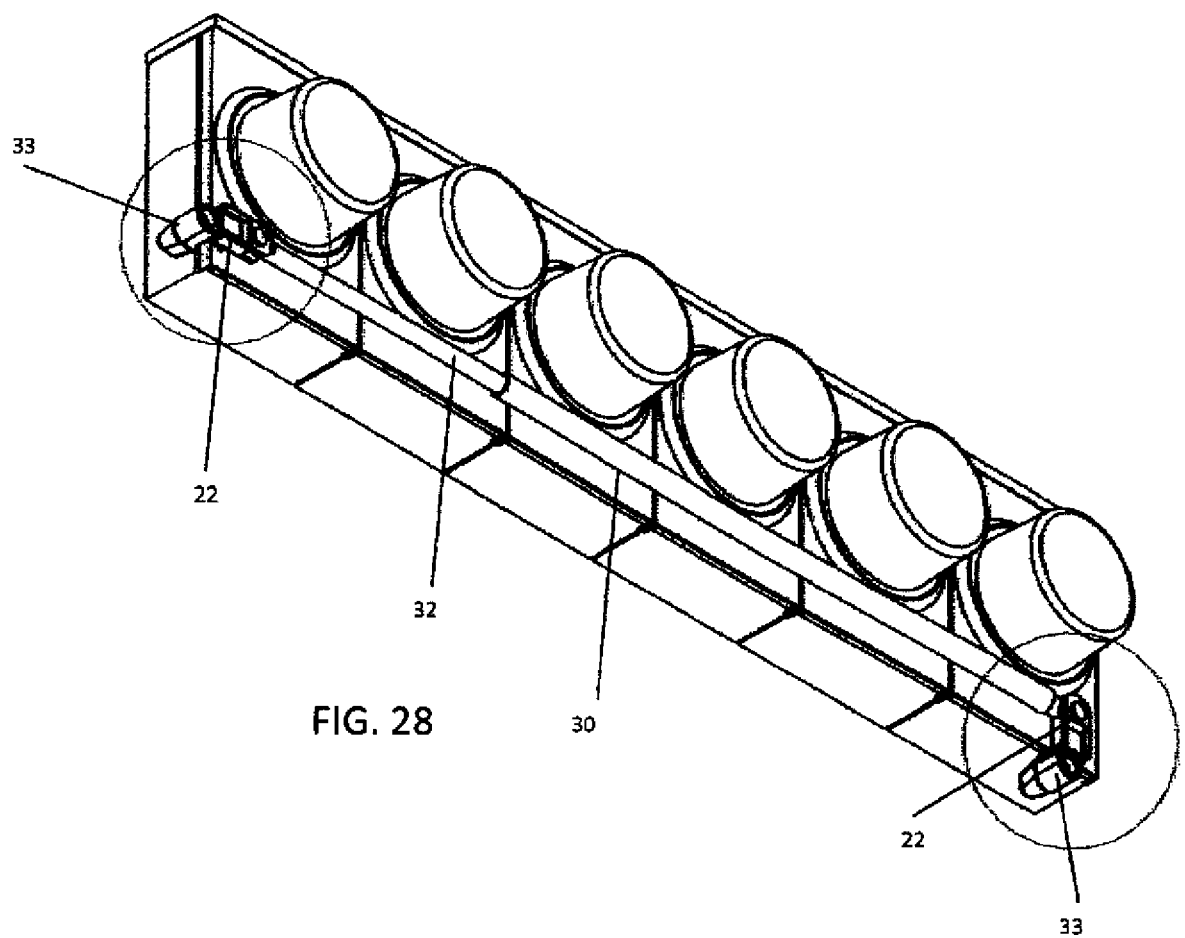
Figure 29:
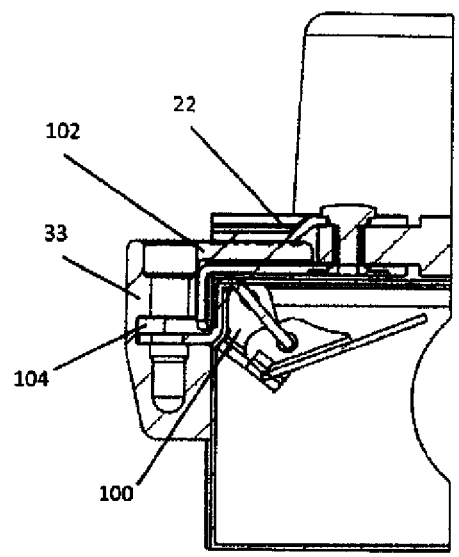
Figure 30:
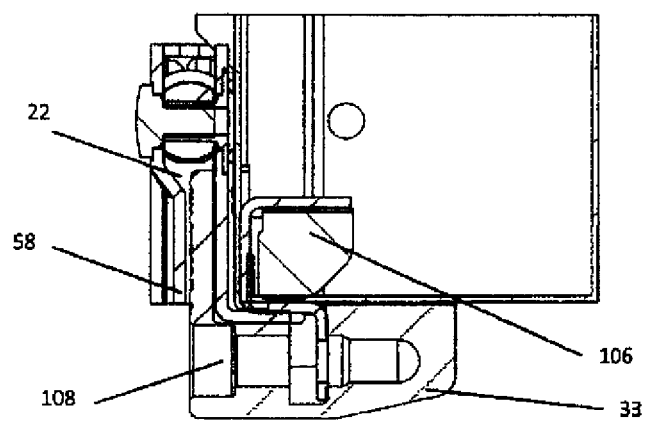
Figure 30B:
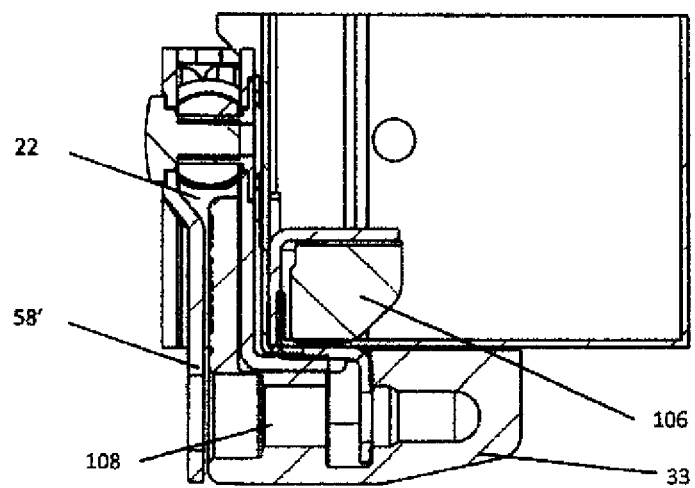

In another example embodiment, FIGS. 21-23 show various configurations of the securing bar assembly without enclosure lock members 10 or 28. FIG. 24, in an example embodiment, shows securing member comprised of two coupling members 22, two sets of fasteners 20 and 24, and a securing bar comprised of rod 32 and sleeve 30. FIG. 25, in an example embodiment, shows a detailed view of the end of securing member comprised of a coupling members 22, a sets of fasteners comprised of carriage bolt 20 and barrel nut 24, and the short securing rod 34 that is fixed to tube 22. In another example embodiment, FIGS. 26, 27A-B show views of securing member assembled with enclosure lock member 33 (which in some embodiments is, for example, a modified version of the DeWalch Technologies ProLock (e.g., locking device) housing). FIG. 28, in an example embodiment, shows the securing member with a ProLock housing 33 in both a bottom configuration, typically as seen in one example embodiment (looking from the bottom of the boxes) and side configuration. FIG. 29, in an example embodiment, shows a cross section view of ProLock side bracket 100 mating with ProLock housing 33. ProLock flange 102 is inserted inside receiving cavity 58 of coupling member 22". FIG. 30, in an example embodiment, shows a cross section view of ProLock bottom bracket 106 mating with ProLock housing 33. ProLock flange 102 is inserted inside receiving cavity 58 of coupling member 22". FIG. 308, in an example embodiment, shows a cross section view of ProLock bottom bracket 106 mating with ProLock housing 33. FIG. 30B also shows that coupling member top surface extends over ProLock 33 with opening aligned with ProLock lock bore 108. The DeWalch Technologies Pro-Lock locking device includes ProLock housing 33, either a bottom bracket or side bracket and a lock. A detail description of these locking devices and systems and their operation are provided in U.S. Pat. No. 7,176,376, and application Ser. No. 12/317,086. The housing may be suitably modified and configured to use the ProLock system.

In another example embodiment, the thickness of the flange on the bottom side is reduced (e.g., of the ProLock housing) (the flange usually contacts an enclosure lid to accommodate the material thickness of the coupling device). The thinner flange functions effectively because of the support provided by the physical encasement of metal walls by the coupling member receiving cavity.

Another example embodiment provides a configuration which increases the relative position of the ProLock housing flange and bracket receiving cavity by an amount equal to the material thickness of the coupling member. This embodiment requires the coupling member receiving cavity height to increase sufficiently for the ProLock housing flange to be insertable.

Another example embodiment provides a configuration which incorporates changes in either one of the two example embodiments, immediately above, with the modification of the coupling member by adding an extending formed surface of the receiving cavity creating a flange that extends to the outermost edge of the ProLock. In the flange a through hole of a diameter closely matching the lock is added and located in alignment with the lock cavity of the ProLock housing. When the lock is inserted in ProLock housing the lock head extends into the coupling member flange hole creating an additional mate with the ProLock system. Thus the lock creates a positive attachment to the bracket attached to the enclosure and the coupling member.

It should be further emphasized that in some embodiments, the securing apparatus comprises only the coupling member or members and the securing member. In such an embodiment, the securing member may be used with other locking devices in the industry. For example, the coupling member receiving cavity could be modified in size, shape, and configuration to accommodate and receive tabs or brackets from other types of locking devices so as to secure the securing member to gang or meter boxes. In this way such a configuration would be more universal in its applications. Moreover the enclosure locking device can also be adapted to receive other locks, barrel, locks used in the industry and a seal or wire seal could be used to indicate any tampering.

In another example embodiment, it will be appreciated that the coupling members may be configured to be is separably and slidably (e.g., translationally along the longitudinal axis of the coupling member) mateable or engageable, or alternately pivotably or rotationally attachable with respect to an appropriately adapted extended member of the bracket arm of their respective first or second enclosure locking member.

In other embodiments, first and second coupling members could also each be moveably (in some embodiments pivotally or rotatably) attachable along the length of the securing bar and/or at the ends of the securing bar.

In an example embodiment, the securing apparatus 8 is adapted to secure a plurality of electric meter boxes, the apparatus being mountable to the plurality of electric meter boxes. In one embodiment, the apparatus comprises first and second enclosure locking members 10, 28 each comprising a bracket arm, a lock, and a housing mountable to at least one meter box, a securing member having first and second ends, the securing member comprising a securing bar, first and second coupling members each being moveably (in some embodiments pivotally or rotatably) attachable to the securing bar, and wherein each coupling member is moveably mateable or engageable with an extended flange of the bracket arm of its respective first or second enclosure locking member.

In some embodiments, the securing apparatus comprises at least one locking member (or device) 12 (see FIG. 7).

In another example embodiment, the securing apparatus comprises at least one enclosure locking member, a securing member (which may have a fixed length, or in other embodiments, a variable length) having first and second ends with the securing member comprising a securing bar and at least one coupling member being moveably (in some embodiments pivotally or rotatably) attachable to a proximal ends of the securing bar. In other embodiments, the coupling member may be rigidly fixed to the securing bar and/or the enclosure locking members. In still other embodiments, the enclosure locking member(s) may be rigidly attached (e.g., by welding or fasteners, adhesives, or otherwise known to one of skill in the art) directly to the ends or intermediate the ends of the securing bar and/or the coupling member.

In other embodiments, one and/or both ends of the securing apparatus may be secured to structure other than a meter box (e.g., a wall, bracket, free, other suitable anchoring) with the enclosure locking members or any of a variety of fastening or securing structures.

In an example embodiment, the coupling members are pivotally or rotationally attached or alternately separably and slidably mateable with an extended member or mating portion, or bracket arm of each of respective first and second enclosure locking members 10, 28. It should also be noted that enclosure locking members 10, 28 may have an identical configuration in some embodiments or different in other embodiments.

For the following paragraph and description regarding FIGS. 34A-34E, reference numerals apply only to these figures and not to other figures herein. Referring to 34A-34E, and particularly to FIG. 34A, the assembly 400 is an equivalent of previously described assembly 300. However, assembly 400 provides for the positional adjustment of horizontal member sub-assembly 402 along tube 401 axis, whereas horizontal members 204 are fixedly attached to vertical tube 200. Item 34 and 202 are the same in both assemblies 300 and 400. Tube 401 with index cavities 417 in FIG. 348 can be of any reasonable length typically ranging from 18 to 45 inches. 417 can be apertures or indentions of round or other shape and spaced regularly along the axis of the tube. Horizontal member sub-assembly 402 clamps tube 401 between clamp plate 405 and horizontal member 405. Tube 401 inserts into apertures 414. The discontinuous aperture with an opening less than 180 degrees contains the tube to only allow axial and rotational movement along tube 401 while preventing radial movement. Clamp plate 404 mates with horizontal member 405. The cooperative dovetail protrusions 412 of 404 and dovetail recesses 413 of 405 limits accepts loads inflicted by forceful attack of securing apparatus, thus limiting load transfer to fasteners 403 that pass through apertures 410 and secure into apertures 411 that would usually be tapped for threaded fastening. A dovetail, tongue-and-groove or similar configuration could be utilized in alternate embodiments. Protrusions 416 inserts into cavities 417 to eliminate axial or rotational movement about tube. Depicted embodiment of vertical tube assembly with adjustable horizontal members enables the user to customize assembly in the field to install required number of members in position that best meets conditions that are often not known until user is on site.

Figure 35B:
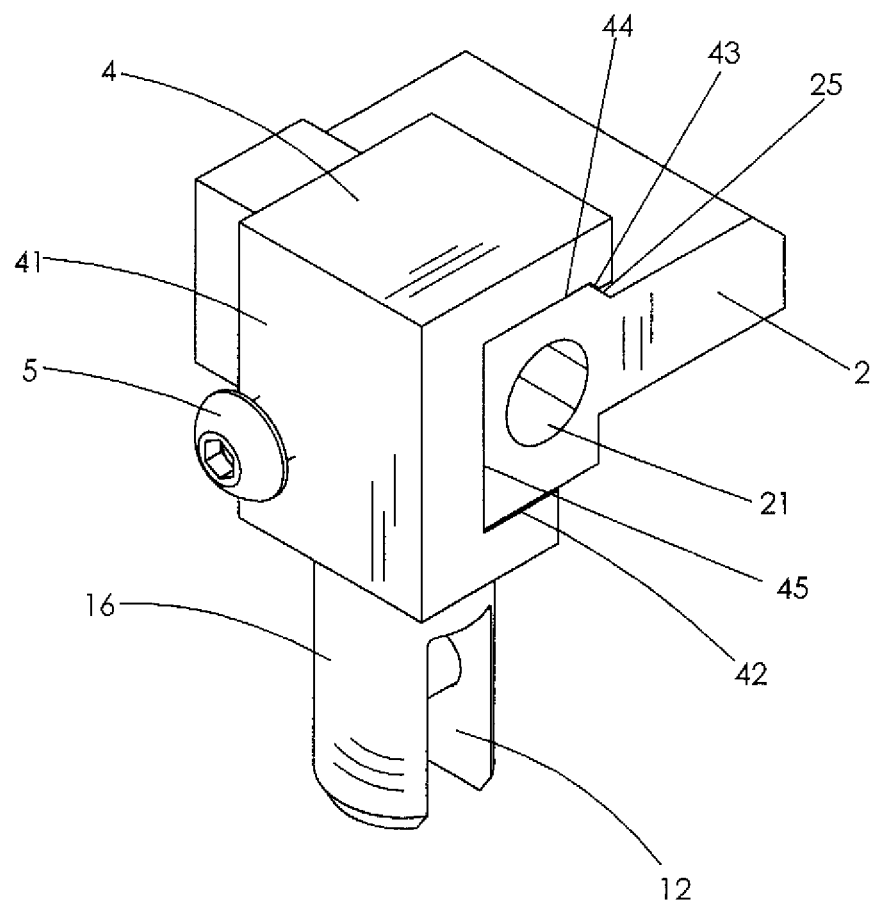
FIG. 35B is a perspective of a low-profile spacer and angle bracket.

For the following paragraph and description regarding FIGS. 35A-35C, 35D1-35D5, reference numerals apply only to these figures and not to other figures herein. Referring to FIGS. 35A-35C, 35D1-35D5, receiver 1 is shown mated with housing 2 by way of a T-slot 22 in the housing and T-body 11 on receiver. To lock assembly, barrel lock (not shown) is inserted into orifice 21 and saddle feature 13. When locked, items 13 and 21 must be concentrically aligned. The receiver pivotally attaches to the securing apparatus or gang bar. The gang bar rod inserts into slot 12 and pivot 3 inserts through hole 13 into a pivot hole in the gang bar rod. In an example embodiment, pivot threads 32 into a flat bottom tapped hole 14 that is axially aligned with through-hole 13. Pivot surface 31 interacts with the gang bar rod pivot hole. The pivot head 33 is mounted or submerged flush into countersunk hole 13. A sloped surface (item 25), cooperates with the assembly tool 4 shown in FIGS. 35A2 and 35C-35D1. The housing has a front face 26. The housing overhang surface 27 interacts with item 15, the flat surface on receiver 1 where the T-body terminates at a larger outside diameter. Structures 27 and 15 along with T-slot and T-body interaction cooperatively resists an attacker from applying a moment to the lock in all but one axis and forces in all but one direction. Defeating the assembly would require the entire shaft to fully shear in two locations, which is extremely difficult. Housing 2 attaches to meter box 9 with bolt 8 that passes from inside of enclosure 9, through bracket accessory 7 or alternatively a washer of some varied configuration, then a hole punched in the enclosure and, then threads into 24, as shown in FIG. 35D2. FIG. 35D4 shows the substantial surface 29 interacting with enclosure surface to effectively distribute any mechanical loads imposed by attack. The housing 2 orientation is controlled by overhang face 23 in cooperation with enclosure flange 91 shown in FIG. 35D2. Overhang face 23 and orientation of lock engagement that enables low profile of housing 2 and low position of lock orifice 21. The position and orientation provide a selected and desired novel configuration. When the locking assembly is used on either side or bottom of meter box, a spacer 6 of FIG. 35B must be used to eliminate the overhang (See generally FIGS. 35A-35C, 35D1-35D5). It should be noted that FIG. 35A2 shows assembly tool 4 that facilitates easy installation. In the field, enclosures are often damaged and deformed. These malformed boxes may bulge out and push the gang bar away from the enclosure, which makes it difficult for an installer to properly seat the receiver into the housing. Assembly tool 4 groove defined by items 42, 43, 44, and 45 mates with the housing items 26, 27 and 25 to slideably attach. If the receiver 1 is not well seated, item 46 will press against 11 as tool is pushed into actuating position, which is attained when receiver body surface 16 contacts assembly tool locating surface 47 as shown in FIG. 35C. Tool ruggedness allows for hammer blows to encourage attaining actuating position if necessary. In actuating position, threaded hole 41 is aligned with centerline of both receiver 1 and T-slot 22. In an example embodiment, bolt 5 can then be driven with a standard hex wrench. Alternatively, bolt 5 could be another head type of bolt or toggle clamp or leverage mechanism. Actuation of tool forces receiver into housing to stop against 28 at which point the centerline of the receiver intersects the centerline of the housing lock orifice 21; thus, with proper orientation of saddle 13 with axis of 21, a barrel lock can be inserted to lock assembly. I should be noted that alternative embodiments of assembly may include receiver 1 with no slot 12 or holes 13 and 14, to, thereby, provide a rod of desired length interrupting operation of an enclosure with a securing apparatus. Another embodiment could include replacement of gang bar telescopic tube arrangement with a tube merely a tube that is cut to length onsite by installer. In such an arrangement, the receiver would again not require slot 12 or holes 13 and 14 but be of appropriate outside diameter to slip into tube.

Various other example embodiments provide an apparatus that may be adapted for use on a utility service enclosure. Such a utility service enclosure is used not only in the electric utility industry (e.g., a meter box) but also in the gas, water, cable, TV utility industries or in other utility industries.

Various other example embodiments provide a securing apparatus that may be adapted for use on a utility service enclosure or on other enclosures needing a locking apparatus. Such an apparatus may be used to secure doors, covers, hatches, access panels for any type of enclosure, container, or to secure a number of adjacently positioned containers together or prevent doors or covers of same from being opened. Moreover, a utility service enclosure or other containers, for example, may have various configurations, shapes and sizes and be used in the electric utility industry, (e.g., a meter box) as well as in the gas, water, cable, TV utility industries and the securing apparatus may be configured to accommodate and secure such various configurations.

As to a further discussion of the manner of usage and operation of the present invention, the same should be apparent from the above description. However, several example embodiments are further provided hereinafter.

The method of use by step, in one example embodiment, is as follows:

At one end of enclosure gang, attach first enclosure locking member housing onto end of meter boxes in the desired configuration of end, top or bottom as dictated by circumstance of accessible surface and work area.

At other end of enclosure gang, attach second enclosure locking member housing onto end of meter boxes in desired configuration of end, top or bottom as dictated by circumstance of accessible surface and work area and in alignment with first enclosure so that final assembly does not cross gang diagonally.

Partially insert first enclosure locking member bracket members (or bracket arms) into first housing.

Partially insert second enclosure locking member bracket members into second housing.

Lift securing member assembly and position to mate with first and second enclosure locking member bracket members.

Slide first enclosure locking member bracket arm into first coupling member until it stops against enclosure locking member housing.

Slide second enclosure locking member bracket arm into second coupling member until it stops against enclosure locking member housing.

Complete insertion of first enclosure locking member bracket members into first housing.

Complete insertion of second enclosure locking member bracket members into second housing.

Tighten screw inside first enclosure locking device.

Tighten screw inside second enclosure locking device.

Insert first lock into first enclosure locking device.

Insert second lock into second enclosure locking device.

In another possible embodiment, alternately, for enclosure locking devices whose bracket members radially move within housing and hold two discrete positions (e.g. DeWalch Technologies, Armadillo device), the method offers a less physically strenuous method as follows:

- At one end of enclosure gang, attach first enclosure locking member housing onto end of meter boxes in desired configuration of end, top or bottom as dictated by circumstance of accessible surface and work area.
- At other end of enclosure gang, attach second enclosure locking member housing onto end of meter boxes in desired configuration of end, top or bottom as dictated by circumstance of accessible surface and work area and in alignment with first enclosure so that final assembly does not cross gang diagonally.
- Partially insert and set in favorable radial position first enclosure locking member bracket members into first housing.
- Partially insert and set in favorable radial position second enclosure locking member bracket members into second housing.
- Lift securing assembly and position to mate with first and second enclosure locking member bracket members.
- Slide first enclosure locking member bracket arm into first coupling member until it stops against enclosure locking member housing. Allow coupled locking device assembly to support this end of the securing assembly.
- Slide second enclosure locking member bracket arm into second coupling member until it stops against enclosure locking member housing. Allow coupled locking device assembly to support this end of the securing assembly.
- Rotationally position first enclosure locking member bracket members to locking position relative to first housing and, then, complete insertion.
- Rotationally position second enclosure locking member bracket members to locking position relative to second housing and, then, complete insertion.
- Tighten screw inside first enclosure locking device.
- Tighten screw inside second enclosure locking device.
- Insert first lock into first enclosure locking device.
- Insert second lock into second enclosure locking device.

Both example methods above offer a less physically strenuous and awkward assembly than some conventional devices whose enclosure locking member bracket members are fixed to bars. For such products, massive assemblies freely spin during steps 5, 6, 7. Another step may be to partially screw bracket member into housing and position flange.

As briefly noted above and further explained herein, many commercial complexes and apartments have watthour meter boxes that are mounted in a multi-meter array called a gang. In order to prevent unauthorized access to the meter boxes, a bar extending across the meter boxes is used to secure them which is locked on both the ends to a meter box. The bar interferes with the opening or removal of a meter box lid. The present invention is adapted to provide locking capability for use in various configurations to secure a gang of watthour meters from unauthorized access by providing a higher security and ease of installation.

In an example embodiment, a telescopic bar comprises swiveling coupling members mounted at the distal ends of the telescopic bar, wherein the coupling members mate to respective enclosure locking members attached at each end of a meter box gang. The swivel integrated with the bar enables multiple attachment configurations and facilitates operator usage. Locking and unlocking of lock devices, in some example embodiments, enables the attachment and detachment of the telescopic bar. When detached, all meters within the gang are accessible. Thus, the telescopic bar can be used repeatedly.

In another example embodiment of the present invention, a securing apparatus provides access security on any gang of enclosures or large cabinet with a lid or door. Such applications might include large telephone, network or power station switch boxes. Any gang of enclosures with multiple access points may be secured in this fashion to improve upon, replace or solely provide access security. Furthermore, the securing apparatus could be used to secure gates or passage ways that might require protection, reinforcement or fortification.

In an example embodiment, the securing apparatus comprises a securing member, first and second coupling members, and first and second enclosure locking members. The coupling member comprising a tab, cavity, adapted for receiving a portion of the enclosure locking member.

In some embodiments of the invention, the securing apparatus can be adapted for use to secure just one meter box.

In other embodiments, a securing apparatus is provided for use with other locking devices. The securing apparatus is adapted to be mounted to such locking devices or systems (possibly other such locking systems used by other in the industry and well know to a person of ordinary skill in the art) to secure a plurality of electric meter boxes. In one embodiment, the securing apparatus comprises a securing member having first and second ends with the securing member comprising a securing bar (e.g., in some embodiments similar to items 30, 32) and first and second coupling members (e.g., in some embodiments similar to items 22/20, FIG. 48, but in other embodiments having a receiving cavity adapted to receive engageable or mateable structure of a locking device different than the enclosure locking member). In some embodiment such coupling members are ideally moveably (in some embodiments pivotally or rotatably) attachable to the proximal distal ends of the securing bar. In an example embodiment, the coupling members are separably and slidably mateable with an extended member or mating portion, or flange of a given locking device. It should also be noted that such locking devices may have an identical configuration in some embodiments or different in other embodiments.

Figure 31:
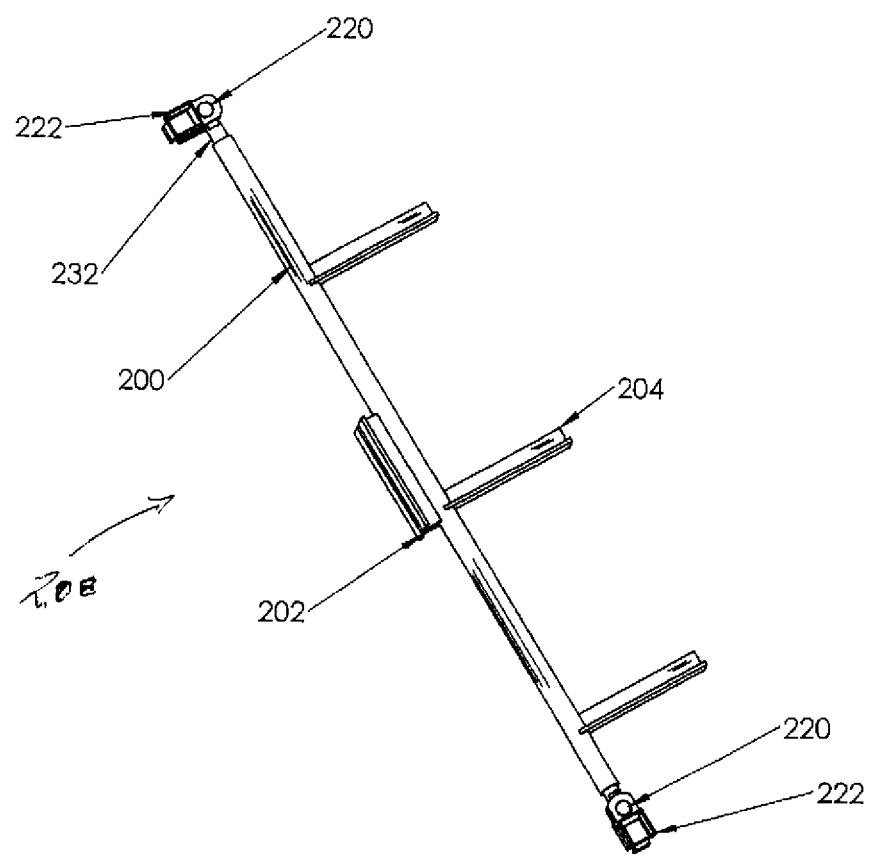
FIG. 31 is a perspective view of an example embodiment of the invention showing a gang bar assembly without the watthour meter boxes.

Turning now to FIG. 31, in another example embodiment, the securing apparatus 208 preferably comprises a at least one projecting member and in some embodiments a plurality of projecting members (or arms) mounted to and extending substantially perpendicularly (in some embodiments (or perpendicular members)) from the securing bar so as to aid in preventing the enclosure lid of cover from being opened. In this way, the plurality of arms aid in securing at least one enclosure, or for example, one or more meter boxes in a gang-like configuration.

The securing apparatus 208 can be attached to enclosures (e.g., switching boxes for telephone companies, electrical substation enclosures or an array(s) of enclosures, lockers for security (e.g., storage, gym, ski, or other lockers or enclosures), enclosures containing switches, circuit breakers, etc.), in various orientations or modes. In some non-limiting example embodiments, the securing apparatus 208 can be adapted for attachment in a substantially horizontal mode and/or in a substantially vertical mode. However, the securing apparatus could also be modified (e.g., by suitably reconfiguring and mounting the projecting members in a non-perpendicular orientation with respect to the outer surface and/or longitudinal axis of the securing member) so that it could be mounted in a non-horizontal or non-vertical orientation (e.g., diagonally or otherwise) on a gang of meter boxes in such a way that the projecting members extend over and prevent the box covers form being opened. In the horizontal mode, as briefly noted above, the securing apparatus enclosure locking members (sometimes referred to as devices) are usually attached furthest from the hinge of an enclosure or enclosures; in many cases, the hinge is usually toward the bottom of the enclosure. For example, in one possible non-limiting embodiment, the securing apparatus may be used with an enclosure such as a watthour meter box. The extendable securing member (or in some embodiments, a bar) ideally covers the full distance of the hinge. In an example embodiment, the overall length of the securing member is sufficient to extend substantially horizontally across the width of a meter box or a gang or group of meter boxes positioned, for example, side-by-side next to one another. However, in other embodiments, the securing apparatus may be oriented diagonally across one or more enclosures (or meter boxes in an example embodiment).

Some example embodiments the securing member may be adapted for use in a substantially vertical mode or orientation. In the vertical mode, as shown in FIGS. 31A-33A, the securing apparatus may be used, for example, on a gang of watt hour meter boxes. The securing apparatus may be attached to the meter box or boxes in various ways. For example, the enclosure locking members may be attached on either side of a given meter box in a gang of boxes.

In an example embodiment, horizontal members are fixedly mounted to the securing member. In another example embodiment, the securing apparatus further comprises, horizontal mounted, fixed in some embodiments and moveable in other embodiments (e.g., reattachable at various location or securable on a rail-like system). The horizontal members are configured and adapted to extend across the lid to provide similar protection as that provided by the securing apparatus when in a horizontal mode. In an example embodiment, at noted above, the design is benefitted by adding fixed horizontal members to the bar member that extend across the lid to provide similar protection as that provided by the horizontal orientation. These horizontal members can be fixed by welding, a suitable threaded or other type of fastener, pin and hole, rivet or any other suitable method or by other methods and fasteners known to a person of ordinary skill in the art. In other example embodiments, as noted, the horizontal member may be moveably mounted to the securing member. For example, non-weld solutions can offer in the field adjustment of position, which can be beneficial to the user (for example, translatable, slidable (e.g., the extendable securing member may comprise rails on a rail-like structure). The design usually includes an anti-rotation feature provided by a fixed protrusion extending in opposite direction of horizontal members. That is, in an example embodiment, two welded L-brackets are provided to enable vertically oriented attachment on either side of enclosures. The L-shape mates with the corner of the enclosure. In an alternate embodiment the horizontal member extends on both sides of the bar member.

FIG. 31 shows the vertical gang bar assembly (or vertical telescopic tube assembly) with coupling member assemblies. Orientation of coupling members is arbitrary and depends on use. Tube 200, which in some embodiments is oriented in a substantially vertical mode, is, in some embodiments, a modification of tube 30 (e.g., FIG. 28), wherein anti-rotation members 202 and lid barrier members 204 (or in some embodiments projecting members or arms) are fixedly attached by welding. Barrier members 204 extend, in some embodiments, substantially horizontally across the meter lid at bottom joint to prevent opening or prying lid open. Anti-rotation members 202 resists rotation of assembly to maintain position of members 204.

In other embodiments barrier members 204 may be attached without welding and may be configured to be detachable or adjustable which provides more flexibility in installation, usage and mounting. In other embodiments lid barrier members 204 may be welded in a predetermined location and non-adjustable. Because gang bar devices may be primarily used as retrofit equipment for existing meter installations, the ability of the user to adjust locations of 204, would enable installation on a greater variety of meters and meter configurations as well as other types of enclosure or lockable enclosures or containers. It is further anticipated that items 202 and 204 could be integrated into a single adjustable component that translates along the tube and can be set into a fixed location to provide a suitable security function.

Figure 32:
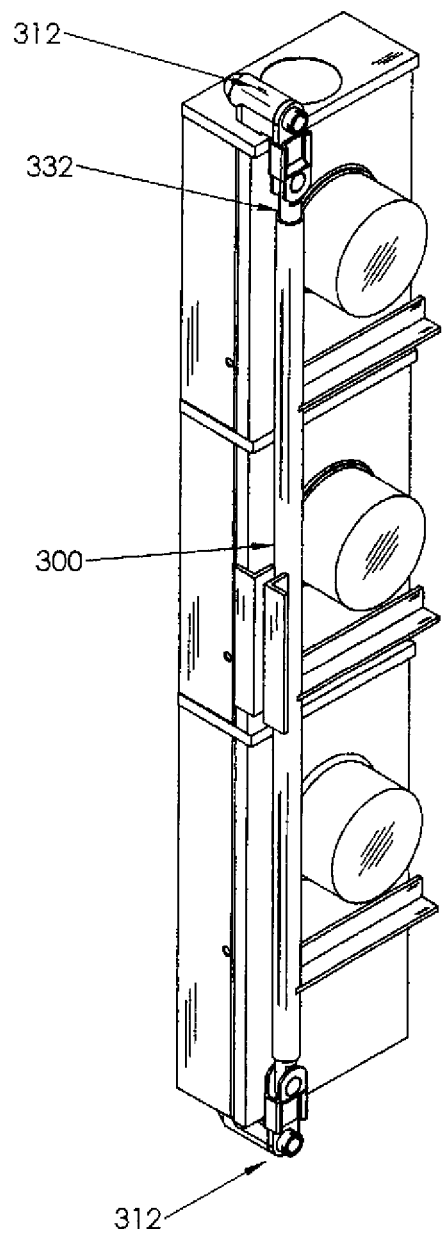
FIG. 32-32A is a perspective view of an example embodiment of the invention showing a vertical gang bar assembly, in the locked position, installed onto watthour meter boxes with a locking device (in some embodiments comprising a locking device referred to as an Armadillo locking device) fixed to the top of the enclosure and another locking device (in some embodiments comprising a locking device referred to as an Armadillo locking device) fixed to the bottom of the enclosure.
Figure 32A:
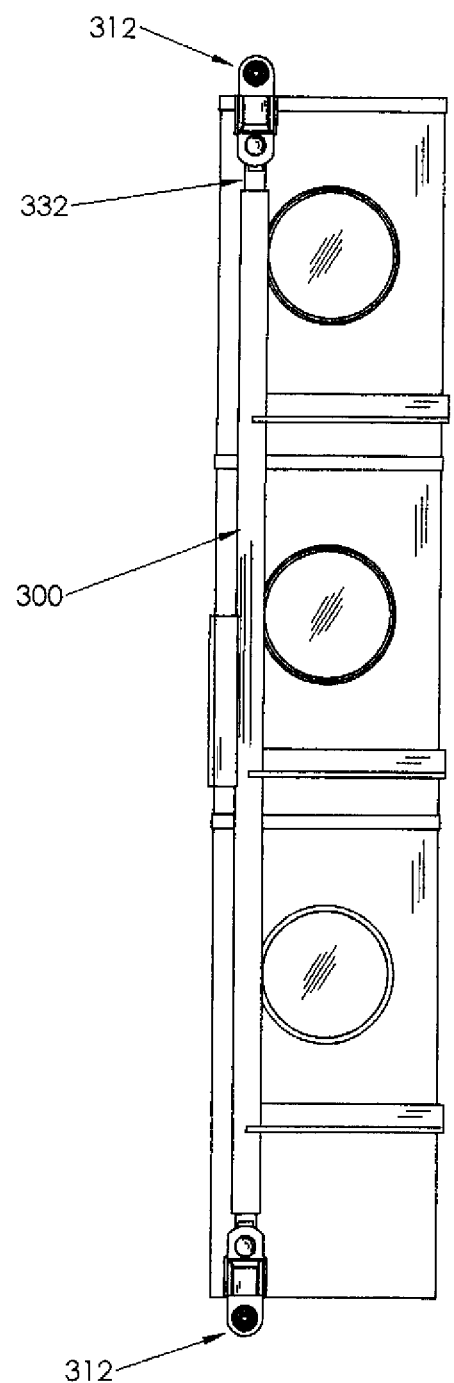
Figure 33:
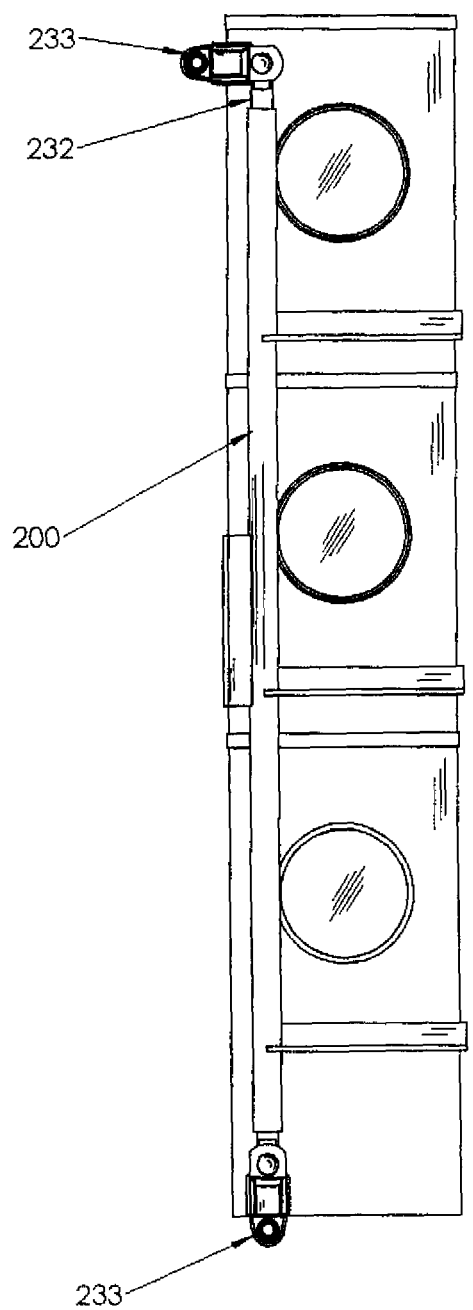
FIG. 33 is a perspective view of an example embodiment of the invention showing a vertical gang bar assembly, in the locked position, installed onto watthour meter boxes with a locking device (in some embodiments comprising a locking device referred to as an Side ProLock locking device) fixed to the side, proximal the top of the enclosure and another locking device (in some embodiments comprising a locking device referred to as an Bottom ProLock locking device) fixed to the bottom of the enclosure.
Figure 33A:
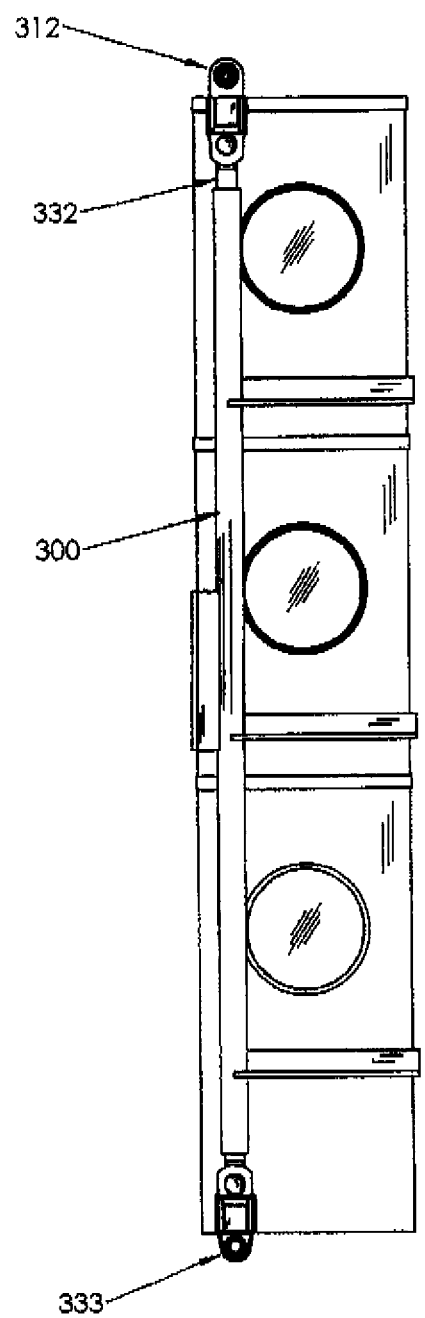
FIG. 33A is a perspective view of an example embodiment of the invention showing a vertical gang bar assembly, in the locked position, installed onto watthour meter boxes with a locking device (in some embodiments comprising a locking device referred to as an Armadillo locking device) fixed to the top of the enclosure and another locking device (in some embodiments comprising a locking device referred to as an Bottom ProLock locking device) fixed to the bottom of the enclosure.
Figure 34A:
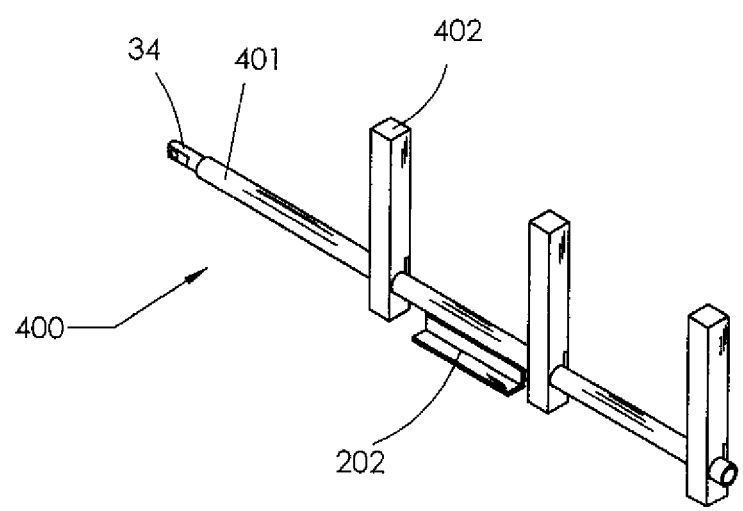
FIGS. 34A-34E include various views of an embodiments including certain members, components, structures, and configurations in accord with possible embodiments of the invention.
Figure 34B:
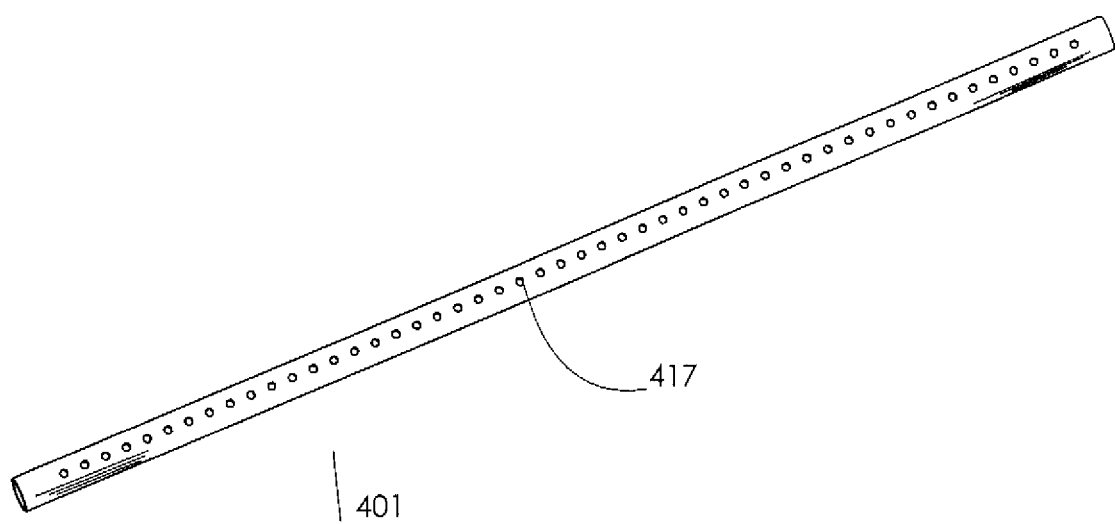
Figure 34C:
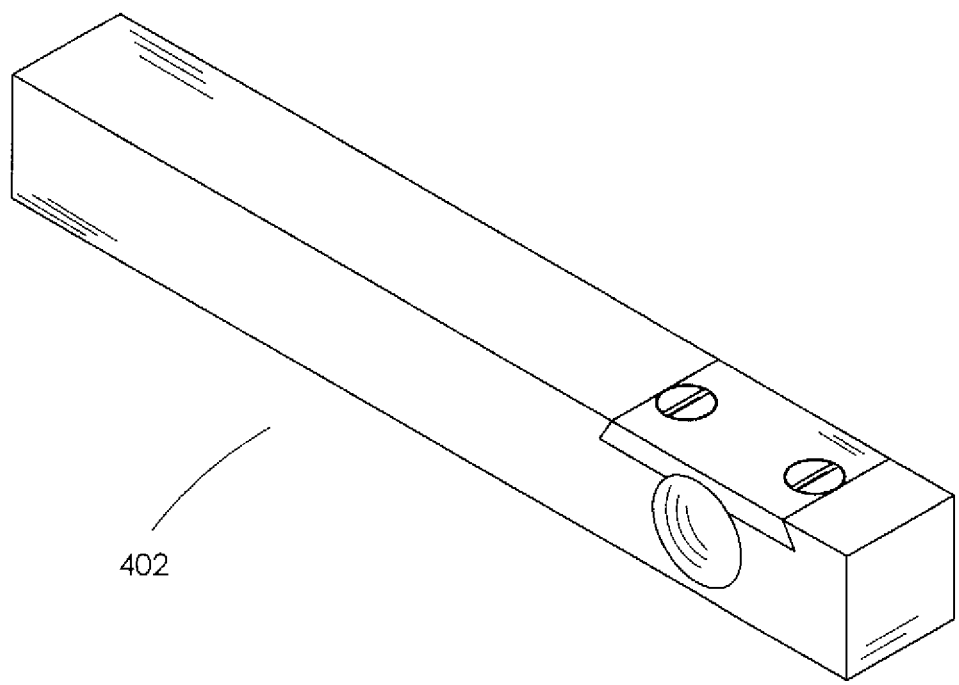
Figure 34D:
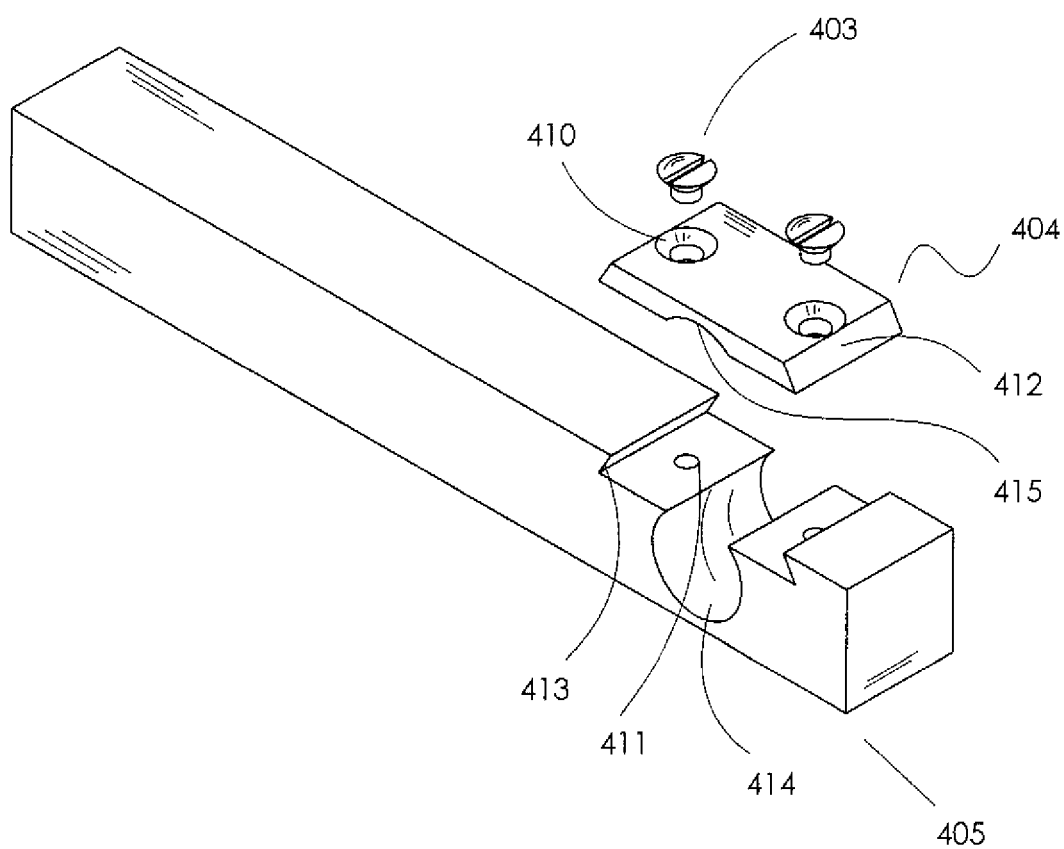
Figure 34E:
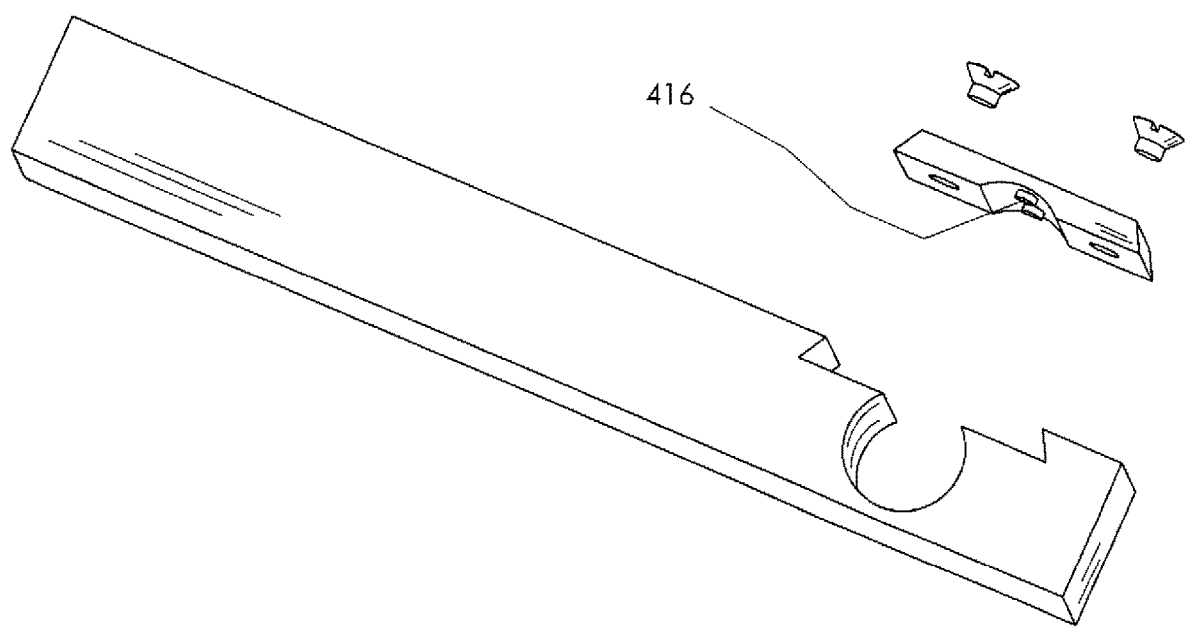

Referring descriptively to the FIGS. 32-33A, in which similar reference characters may denote similar elements throughout the several views, the attached figures illustrate a securing apparatus for preventing access to a gang of watthour meter boxes.

FIGS. 31-33A show non-limiting embodiments of some possible configurations of the vertical securing apparatus (or vertical gang bar assembly) with the enclosure locking members 312, 312 installed onto a gang of watthour meter boxes where the coupling member assemblies (including the coupling member and fasteners) are in line with the securing bar (or vertical telescopic tube assembly) 300, (e.g., in an example, embodiment, see also FIG. 31-33A).

An example embodiment further provides an apparatus adapted to be mounted to secure at least one enclosure as provided (in some embodiments similar to FIGS. 6-9, 14), the apparatus comprising: first and second enclosure locking members comprising a body portion and a mating portion (in some embodiments, for example, 14', 18'); and a securing member having first and second ends with the securing member comprising a securing bar and first and second coupling members with each being moveably attachable to the proximal distal ends of the securing bar, wherein the first and second coupling members are separably mateable with a mating portion of each of the respective first and second enclosure locking members. In a further example embodiment, the apparatus above is provided wherein the at least one enclosure has a wall and sidewall and a cover oriented generally perpendicularly to the sidewall, wherein body portion of each of the first and second enclosure locking members forms a recess, the recess being adapted to receive a fastening member for fastening the enclosure locking member to a wall or sidewall. In still a further example embodiment, the apparatus above is provided wherein the recess is further adapted to receive a barrel lock (in some embodiments, for example, 16'); comprising a generally cylindrical body with one or more retractable locking elements extending therefrom, wherein the barrel lock may be received and secured in the body portion in such a way as to protect the fastener from tampering.

Figure 36A:
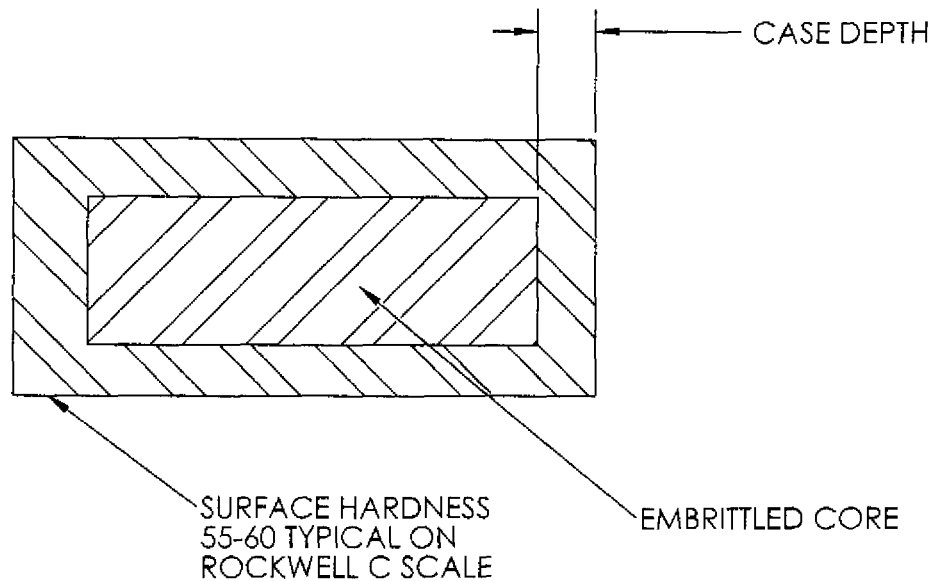
FIGS. 36A-36B includes diagrams describing certain aspects of methodology and processes as noted herein.
Figure 36B:
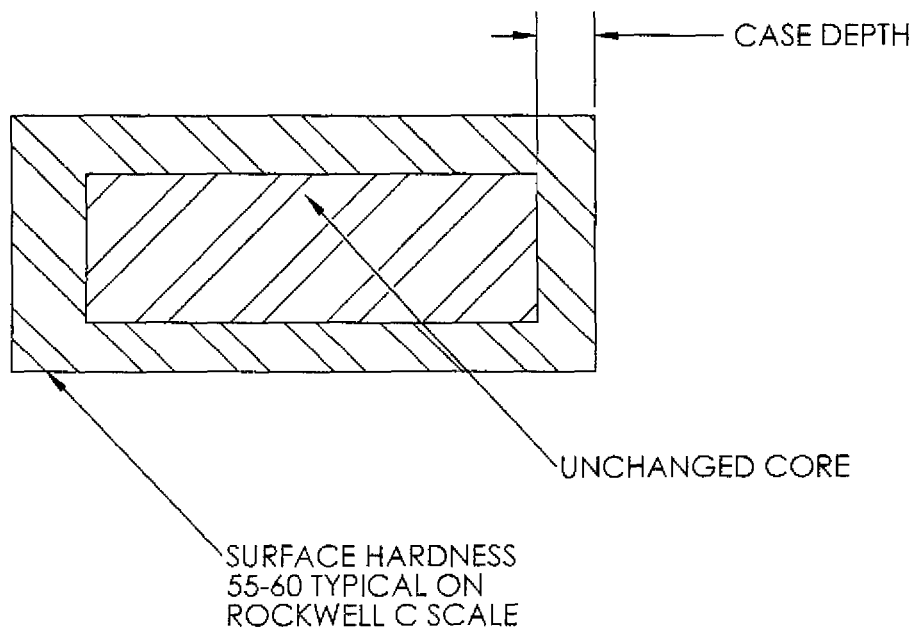

Another embodiment related to, for example, at least a method of manufacturing structures, enclosures, devices, or for example in some embodiments, utility revenue protection apparatus, devices and components and related to methods of processing material used for the above is also provided herein (See generally FIGS. 36A-36B). In the Revenue Protection industry, security products are typically made of low carbon steel (in the 1000 Series of the ANSI system of steel designation), case hardened to a depth of 0.003-0.005 inches by heat treatment and plated with corrosion resistant treatment. This combination provides low cost with high surface hardness necessary to resist attack by means of a hacksaw or grinding cutting methods. There are many known methods of case hardening low carbon steels. Both case hardening processes discussed herein, carbonitriding and ferritic nitrocarburizing, are well known in the heat treating industry, that have many methods and derivatives, which necessitates a generalized description. However, such processes may be specially employed for use in manufacturing processes related to certain materials to produce various superior advantageous features in utility revenue locking devices as noted herein.

Test measurements of surface harness for subject low carbon steel on the Rockwell C scale are 70+ from ferritic nitrocarburizing and up to 60 from carbonitriding. The purpose of these processes is to diffuse nitrogen and carbon atoms in a solid solution of iron, thus entrapping the diffused atoms in the interstitial lattice spaces in the steel structure. Time, temperature and environment are the controlling variables of case hardening. Depth of case at a given environment and temperature is controlled by time. In some embodiments, a higher strength device have improved durability, ductility, hardness is produced. Moreover, when such processes are used to manufacture such structures as noted herein, various benefits result including a notable reduction in the deformity of various components. In this way, the interoperability, engagement and intercooperation between various structures in embodiments as noted herein is improved.

In the Revenue Protection industry, carbonitriding is the standard process for low carbon steel, because of effectiveness and low cost. Harness measurements of competitor products consistently fall in the Rockwell C range of 50-60. Observations and specifications indicate carbonitriding is the exclusive process in the industry.

Carbonitriding low carbon steel requires heating above the critical temperature (about 1340° F. depending upon alloy composition) causing phase transformation from terrific to austenitic to a range of 1400° F. to 1600° F. within an atmosphere usually comprised of an enriched carrier gas from an endothermic generator, plus about 10% anhydrous ammonia for usually about 20-30 minutes. Maximum surface hardness usually obtained by oil quenching directly from the carbonitriding temperature. Unfortunately, part deformation often occurs during quenching, but this can be minimized by quenching in hot oil. For the long tube and rod in the gang bar and especially the vertical design with the horizontal attachments, in accordance with some embodiments as noted herein, deformation can ruin the work product or require significant additional labor to make certain or all parts useable. For example, warpage can occur along the longitudinal axis or radial axis (e.g., in a cross-sectional view), impairing telescopic (or slidable, rotational) cooperation between and relative operability of the tube and rod as well as other heat treated components. This is a further problem in view of the horizontal attachments This rework often includes heat application that reduces the desired high surface hardness. Also of concern is the core metal below the case hardening that may have a brittle structure from quenching. Tempering the steel at 300 to 400° F. can reduce brittleness without appreciable impairment of case hardness.

A thermochemical treatment called ferritic nitrocarburizing is a superior method, though more expensive, when heat treatment induced deformation or very high surface hardness matters. The process, like carbonitriding, exposes the steel to an environment enriched with nitrogen and carbon at elevated temperature; however, it is heated to only about 1100° F., which is below the critical temperature and, consequently, the steel remains ferritic. Quenching from this lower temperature yields comparatively negligible distortion. The chemical environment can be a gas, cyanide salt bath, or in one example embodiment, a bath of powder chemicals. Contributing to the higher cost is the long process time of many hours. Importantly, the core material below case depth remains significantly unchanged and retains original as milled mechanical properties including ductility.

For security products that can tolerate the higher processing cost or economically benefit from reduced deformation or require superior surface hardness, ferritic nitrocarburizing is superior to other case hardening processes. The 17%-27% higher hardness is a significant improvement in attack resistance. Finally, in the case of the gang bar, the productivity improvements from reduced deformation are considerable because minimal deformation means significantly higher process production yield. Consequently, the economic benefits of the productivity gains far exceed the higher cost of ferritic nitrocarburizing.

Ferritic Nitrocarburizing Process. Despite the name, the process is a modified form of nitriding and not carburizing. The shared attributes of this class of this process is the introduction of nitrogen and carbon in the ferritic state of the material. The processes are grouped into four main classes: gaseous, salt bath, ion or plasma, or fluidized-bed. The trade names and processes (patented in some cases) may vary slightly from the general description, but they are all a form of ferritic nitrocarburizing.

Salt bath terrific nitrocarburizing. Salt bath ferritic nitrocarburizing is also known as liquid ferritic nitrocarburizing, liquid nitrocarburizing, liquid nitriding, or salt bath nitriding. It is also known by the trademarked names Tufftride and Tenifer.

The most simple form of this process is encompassed by the trademarked Melonite process, also known as Meli 1. It is most commonly used on steels, sintered irons, and cast irons to lower friction and improve wear and corrosion resistance.

The process uses a salt bath of alkali cyanate. This is contained in a steel pot that has an aeration system. The cyanate thermally reacts with the surface of the workpiece to form alkali carbonate. The bath is then treated to convert the carbonate back to a cyanate. The surface formed from the reaction has a compound layer and a diffusion layer. The compound layer consists of iron, nitrogen, and oxygen, is abrasion resistant, and stable at elevated temperatures. The diffusion layer contains nitrides and carbides. The surface hardness ranges from 800 to 1500 HV depending on the steel grade. This also inversely affects the depth of the case; i.e. a high carbon steel will form a hard, but shallow case.

A similar process is the trademarked Nu•Tride process, also known incorrectly as the Kolene process (which is actually the company's name), which includes a preheat and an intermediate quench cycle. The intermediate quench is an oxidizing salt bath at 400° C. (752° F.). This quench is held for 5 to 20 minutes before final quenching to room temperature. This is done to minimize distortion and to destroy any lingering cyanates or cyanides left on the workpiece.

Other trademarked processes are Sursulf and Tenoplus. Sursulf has a sulfur compound in the salt bath to create surface sulfides which creates porosity in the workpiece surface. This porosity is used to contain lubrication. Tenoplus is a two-stage high-temperature process. The first stage occurs at 625° C. (1,157° F.), while the second stage occurs at 580° C. (1,076° F.).

Gaseous ferritic nitrocarburizing. Gaseous ferritic nitrocarburizing is also known as controlled nitrocarburizing, soft nitriding, and vacuum nitrocarburizing or by the tradenames NitroTec, Nitemper, Deganit, Triniding, Nitroc, and Nitrowear. The process works to achieve the same result as the salt bath process, except gaseous mixtures are used to diffuse the nitrogen and carbon into the workpiece. In this embodiment we use Corr-I-Dur® which is an alternative to salt bath nitriding with oxidation.

The parts are first cleaned, usually with a vapor degreasing process, and then nitrocarburized around 570° C. (1,058° F.), with a process time that ranges from one to four hours. The actual gas mixtures are proprietary, but they usually contain ammonia and an endothermic gas. (See last two references listed under "References" below).

In an example embodiment, a process for treating revenue protection security devices utilizing telescoping tube and rod configuration or structure (as well as in possible embodiments other members, components, and/or structures could also be treated as suitable) is provided. The process includes at least the steps of: procuring stock tubes and rods conforming to dimensional and ferrous material composition specifications; machining rods and tubes to specification with features necessary for cooperation with additional components of entire security device; welding short rod to one end of tube where rod is partially inserted into tube and a fillet weld bonds the circumferential intersection entirely or partially, and wherein the other tube end remains open for accommodating sliding relationship of the tube and inserted long rod; placing a stack of rods or tubes into a chamber sufficiently dense to maximize economy while exposing treatment surfaces to environment; performing ferritic nitrocarburizing to create hardened surfaces with a depth of 0.002 to 0.005 inch by: i) supplying the chamber with a highly enriched atmosphere of nitrogen and carbon, usually provided by 40:60 mixture of methane and ammonia at an elevated temperature of 1100° F. to nitrocarburise the outer surfaces in a single treatment step for a time of 2 to 3 hours; and packing parts within proprietary bath of powder chemicals that provides an enriched environment of nitrogen and carbon at an elevated temperature of 1100° F. to nitrocarburise the outer surfaces in a single treatment step for a time of 2 to 3 hours; and removing the stack of rods or tubes from the chamber. In an example embodiment, the above process also may be provided wherein the tubes or rods are finished machined before being stacked in heat treat chamber, so that after the nitro-carburizing process they require no further machining or forming or reworking prior to use. Parts may be treated for corrosion resistance before ready for use. In an example embodiment, the any of the above processes also may be provided wherein the rods and tubes have a minimal gap when assembled, and are to form a telescoping rod and tube assembly, the rods and tubes being stacked in heat treat chamber with their gaps open. The above processes may also be modified for different components, member and/or other structures having a variety of geometries and configurations.

With respect to the above description then, it is to be realized that the optimum dimensional relationships for the parts of the invention, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present invention.

The design described does not limit the scope of the embodiments of invention; the number of various elements may change, or various components may be added or removed to the above-described concept, for example, to aid in improved security and operation.

The foregoing disclosure and description of embodiments of the invention is illustrative and explanatory of the above and variations thereof, and it will be appreciated by those skilled in the art, that various changes in the design, organization, order of operation, means of operation, equipment structures and location, methodology, the use of mechanical equivalents, such as different types of fasteners and locking devices than as illustrated whereby different steps may be utilized, as well as in the details of the illustrated construction or combinations of features of the various elements may be made without departing from the spirit of the embodiments of the invention. As well, the drawings are intended to describe various concepts of embodiments of the invention so that presently preferred embodiments of the invention will be plainly disclosed to one of skill in the art but are not intended to be manufacturing level drawings or renditions of final products and may include simplified conceptual views as desired for easier and quicker understanding or explanation of embodiments of the invention. As well, the relative size and arrangement of the components may be varied from that shown and the embodiments of the invention still operate well within the spirit of the embodiments of the invention as described hereinbefore and in the appended claims. Thus, various changes and alternatives may be used that are contained within the spirit of the embodiments of the invention.

Accordingly, the foregoing specification is provided for illustrative purposes only, and is not intended to describe all possible aspects of the example embodiments of the invention. It will be appreciated by those skilled in the art, that various changes in the ordering of steps, ranges, interferences, spacings, hardware, and/or attributes and parameters, as well as in the details of the illustrations or combinations of features of the methods and system discussed herein, may be made without departing from the spirit of the embodiments of the invention. Moreover, while various embodiments of the invention have been shown and described in detail, those of ordinary skill in the art will appreciate that changes to the description, and various other modifications, omissions and additions may also be made without departing from either the spirit or scope thereof.

REFERENCES

The following references, to the extent that they provide exemplary procedural or other details supplementary to those set forth herein, are specifically incorporated herein by reference.

U.S. Pat. No. 7,176,376
U.S. Pat. No. 5,870,911
U.S. application Ser. No. 12/317,086
Pye, David (2003). *Practical nitriding and ferritic nitrocarhurizing*. ASM International, *ISBN* 9780871707918.
Joseph R. Davis (2001). *Surface engineering for corrosion and wear resistance*. ASM International. ISBN 0871707004.
T. Bell, Ferritic Nitrocarburizing, Met. Eng. Q., May 1976, reprinted in Source Book on Nitriding, P. M. Unterweiser and A. G. Gray, Ed., American Society for Metals, 1977, p 266-278

The Cassel Manual of Heat-Treatment and Case Hardening, 7th ed., Imperial Chemical Industries Ltd., United Kingdom, 1964

Joseph Lucas Ltd., United Kingdom, British Patent 1,011,580

B. Prenosil, Structures of Layers Produced by Bath Nitriding and by Nitriding in Ammonia Atmospheres with Hydrocarbon Additions, Härt-Tech. Mitt., Vol 20 (No. 1), April 1965, p 41-49 (BISI translation 4720)

J. R. Davis, Ed., Surface Engineering for Corrosion and Wear Resistance, ASM International, 2001, p 191 http://www.burlingtoneng.com/melonite.html http://www.haustrupbodycote.dk/documents/00035.pdf http://www.haustrupbodycote.dk/documents/00036.pdf

What is claimed is:

1. An apparatus adapted to be mounted to secure at least one enclosure, the apparatus comprising:
    first and second enclosure locking members each comprising a body portion and a mating portion, wherein the mating portion comprises a flange; and
    a securing member having first and second ends with the securing member comprising a securing bar and first and second coupling members being pivotally attachable proximal respective first and second ends of the securing bar, wherein the first and second coupling members are slidably mateable with the respective flange of the mating portion of the respective first and second enclosure locking members members, and wherein the first and second coupling members are slidably separable from the respective flange of the mating portion of the respective first and second enclosure locking members.

2. The apparatus as in claim 1, wherein the at least one enclosure has a wall and sidewall and a cover oriented generally perpendicularly to the sidewall, wherein the body portion of each of the first and second enclosure locking members forms a recess, the recess being adapted to receive a fastening member for fastening the enclosure locking member to the wall or sidewall.

3. The apparatus as in claim 2, wherein the recess is further adapted to receive a barrel lock comprising a generally cylindrical body with one or more retractable locking elements extending therefrom, wherein the barrel lock may be received and secured in the body portion in such a way as to protect the fastener from tampering.

* * * * *